US011532771B2

(12) United States Patent
Lee et al.

(10) Patent No.: US 11,532,771 B2
(45) Date of Patent: Dec. 20, 2022

(54) SEMICONDUCTOR DEVICE PACKAGE

(71) Applicant: SUZHOU LEKIN SEMICONDUCTOR CO., LTD., Taicang (CN)

(72) Inventors: Seung Jae Lee, Seoul (KR); Sung Joo Song, Seoul (KR); Yeong June Lee, Seoul (KR); Koh Eun Lee, Seoul (KR); Hui Seong Kang, Seoul (KR); Min Ji Jin, Seoul (KR)

(73) Assignee: SUZHOU LEKIN SEMICONDUCTOR CO., LTD., Taicang (CN)

( * ) Notice: Subject to any disclaimer, the term of this patent is extended or adjusted under 35 U.S.C. 154(b) by 282 days.

(21) Appl. No.: 16/980,125

(22) PCT Filed: Mar. 12, 2019

(86) PCT No.: PCT/KR2019/002838
§ 371 (c)(1),
(2) Date: Sep. 11, 2020

(87) PCT Pub. No.: WO2019/177335
PCT Pub. Date: Sep. 19, 2019

(65) Prior Publication Data
US 2021/0013378 A1  Jan. 14, 2021

(30) Foreign Application Priority Data

Mar. 13, 2018 (KR) .................. 10-2018-0029187
Mar. 13, 2018 (KR) .................. 10-2018-0029188
Mar. 13, 2018 (KR) .................. 10-2018-0029189

(51) Int. Cl.
*H01L 33/50* (2010.01)
*H01L 33/48* (2010.01)
*H01L 33/62* (2010.01)

(52) U.S. Cl.
CPC .......... *H01L 33/502* (2013.01); *H01L 33/483* (2013.01); *H01L 33/507* (2013.01); *H01L 33/62* (2013.01)

(58) Field of Classification Search
CPC ... H01L 33/502; H01L 33/483; H01L 33/507; H01L 33/62
See application file for complete search history.

(56) References Cited

U.S. PATENT DOCUMENTS

2013/0234274 A1*  9/2013  Kam ................. H01L 33/58
                                                      257/432
2017/0338388 A1* 11/2017  Wu ................... H01L 33/486
(Continued)

FOREIGN PATENT DOCUMENTS

JP     2007-180347 A     7/2007
JP     2013-42079 A      2/2013
(Continued)

*Primary Examiner* — Mark W Tornow
(74) *Attorney, Agent, or Firm* — Birch, Stewart, Kolasch & Birch, LLP

(57) ABSTRACT

An embodiment discloses a semiconductor device package comprising: a body including a cavity; a semiconductor device disposed in the cavity; a light transmitting member disposed in the cavity; and an adhesive layer for fixing the light transmitting member to the body, wherein the semiconductor device generates light in an ultraviolet wavelength band, and the adhesive layer comprises polymer resin and wavelength conversion particles which absorb the light in the ultraviolet wavelength band and generate light in a visible wavelength band.

20 Claims, 19 Drawing Sheets

(56) References Cited

U.S. PATENT DOCUMENTS

| | | | |
|---|---|---|---|
| 2018/0216787 A1* | 8/2018 | Chung | F21K 9/232 |
| 2018/0259137 A1 | 9/2018 | Lee et al. | |
| 2020/0144458 A1* | 5/2020 | Lee | H01L 33/504 |

FOREIGN PATENT DOCUMENTS

| | | |
|---|---|---|
| JP | 2017-11200 A | 1/2017 |
| KR | 10-2012-0127184 A | 11/2012 |
| KR | 10-2013-0063421 A | 6/2013 |
| KR | 10-2013-0101846 A | 9/2013 |
| KR | 10-2016-0059325 A | 5/2016 |
| KR | 10-2016-0064537 A | 6/2016 |
| KR | 10-2017-0114450 A | 10/2017 |

\* cited by examiner

[FIGURE 1]
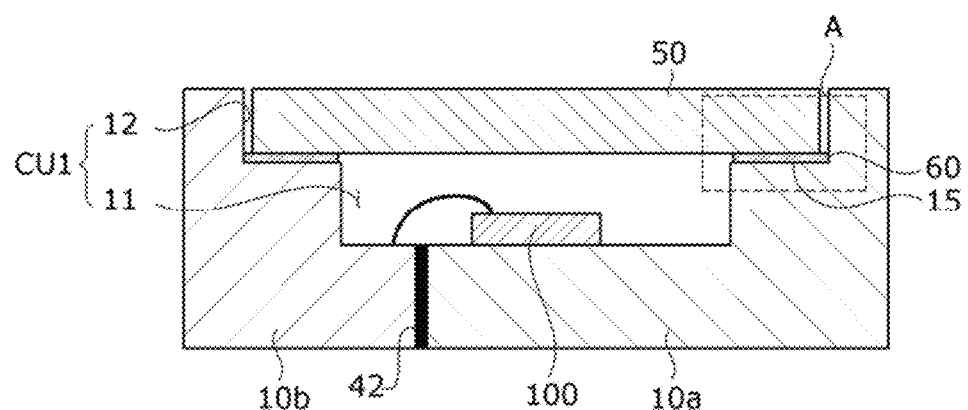
[FIGURE 2]
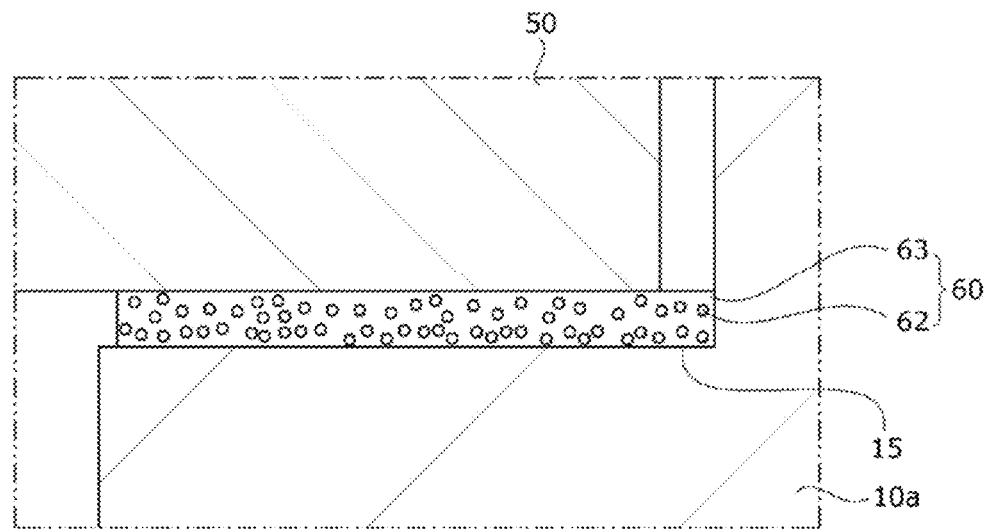

【FIGURE 3】
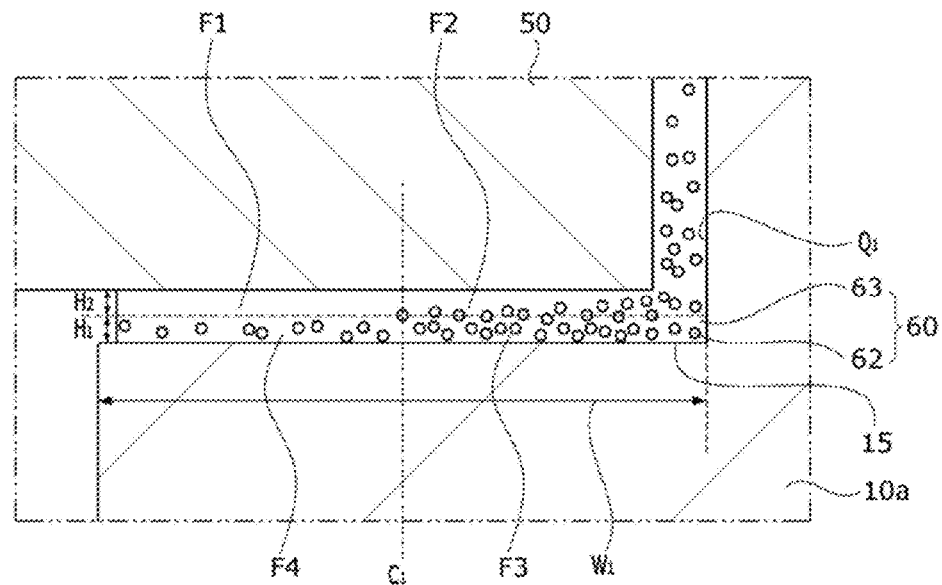
【FIGURE 4】
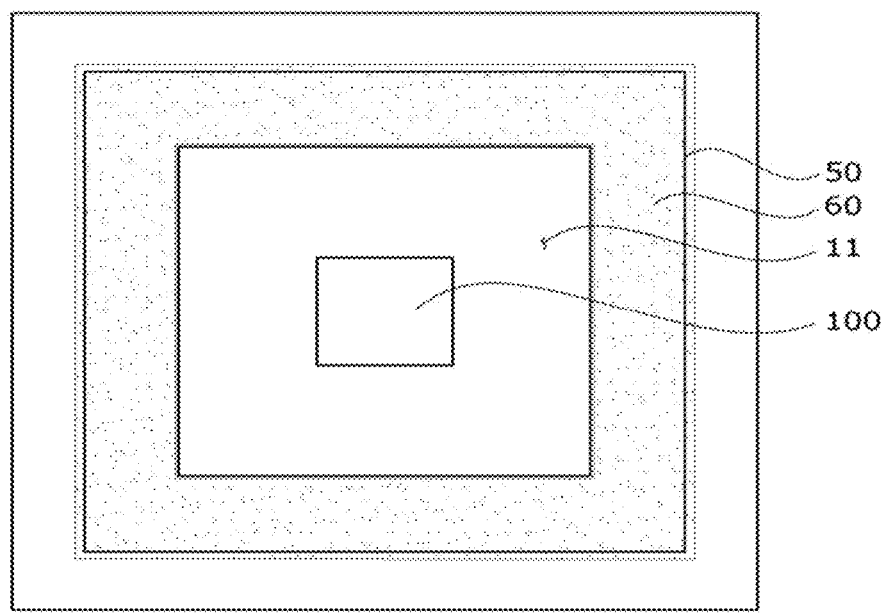

[FIGURE 5]
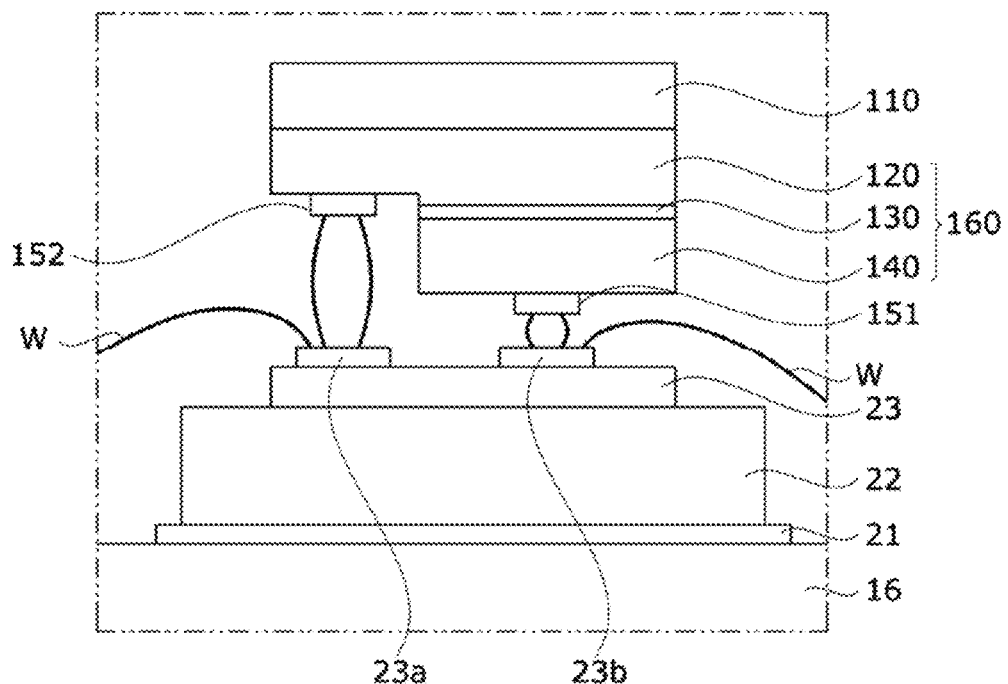
[FIGURE 6]
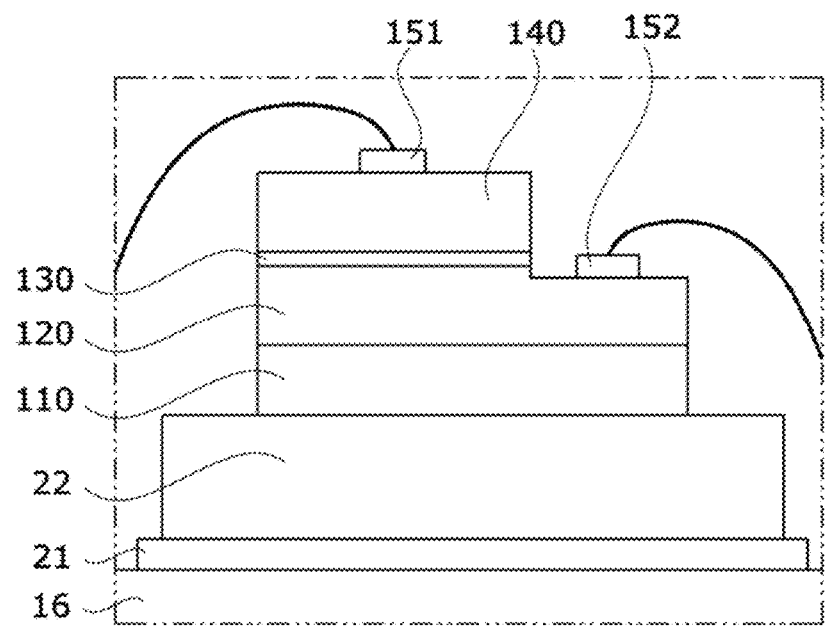

[FIGURE 7]
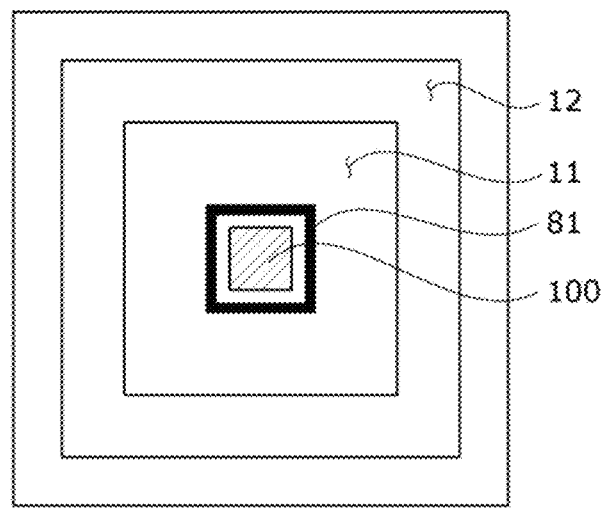
[FIGURE 8]
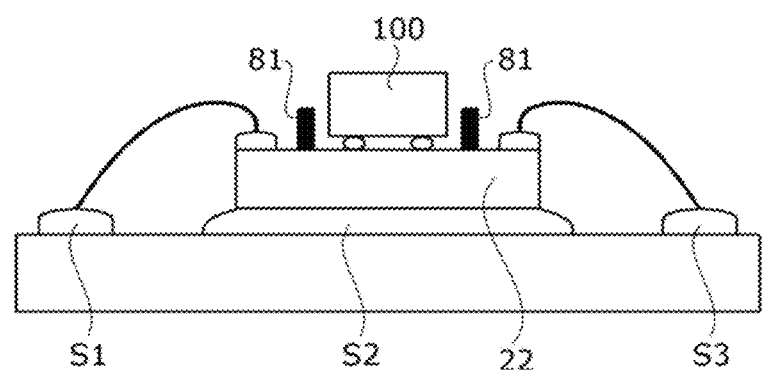

[FIGURE 9]
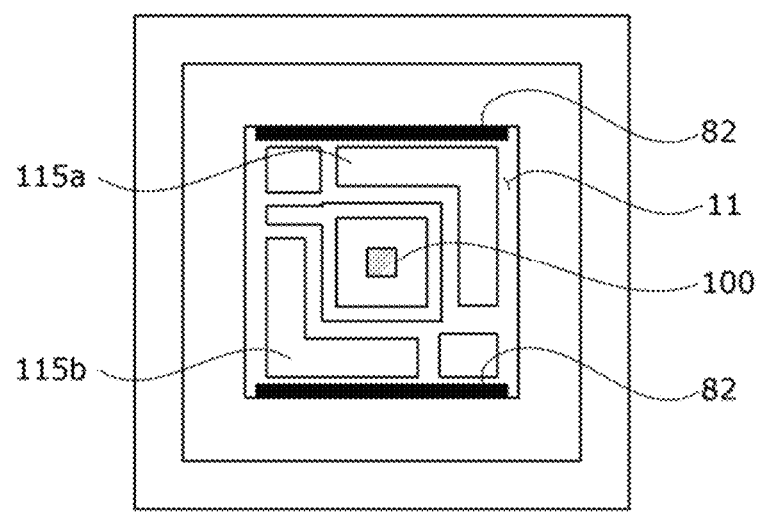
[FIGURE 10]
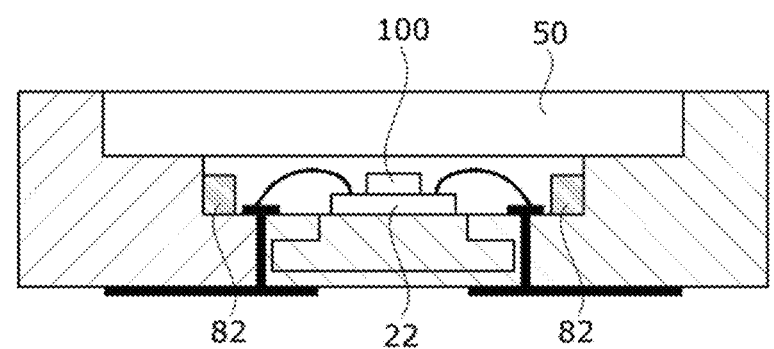

[FIGURE 11]
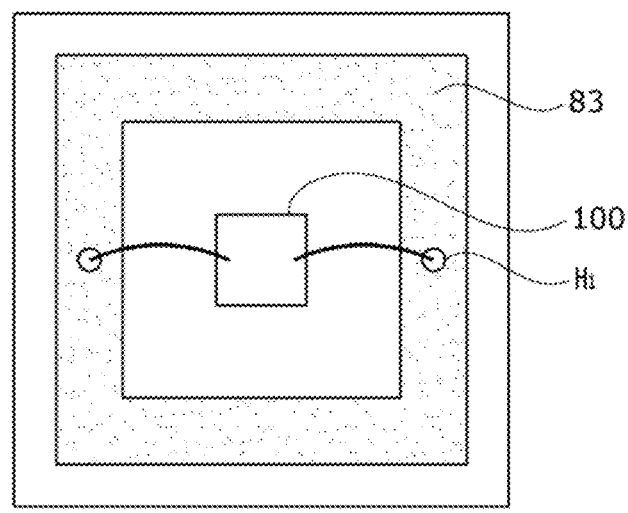
[FIGURE 12]
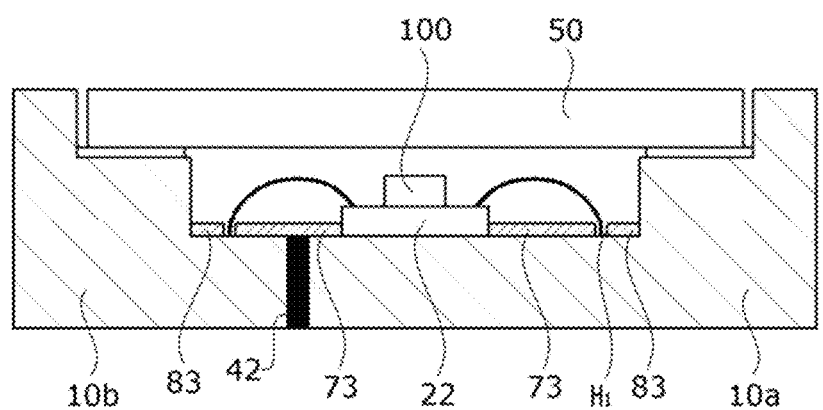

[FIGURE 13]
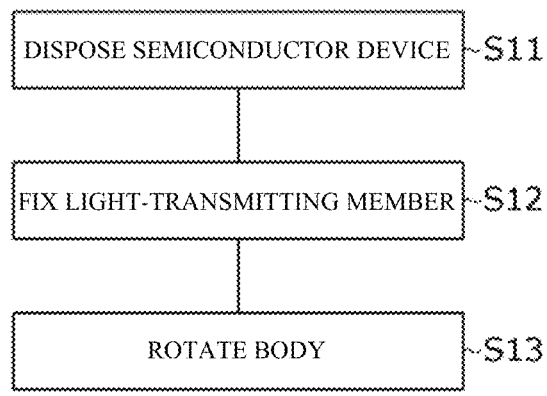
[FIGURE 14]
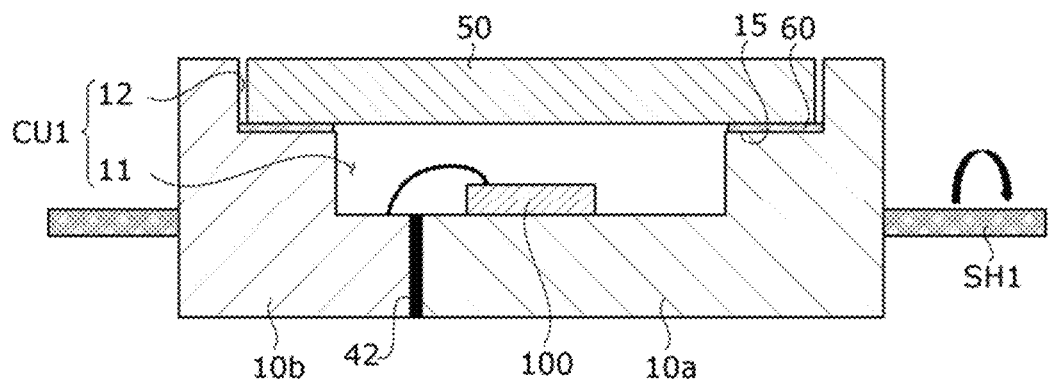
[FIGURE 15A]
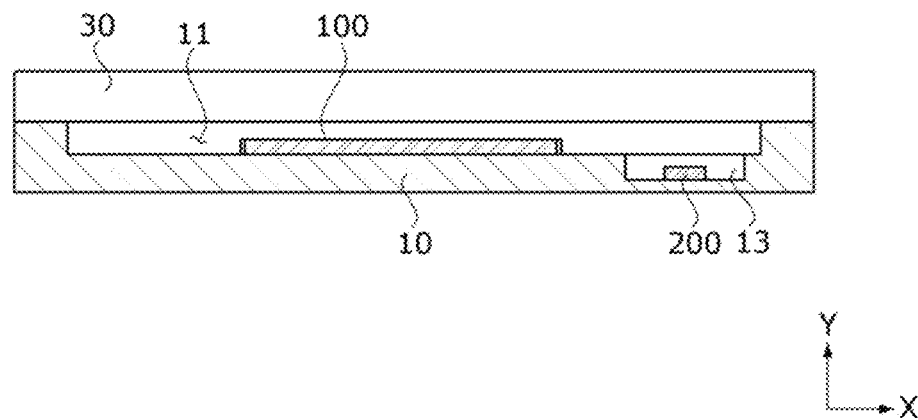

[FIGURE 15B]
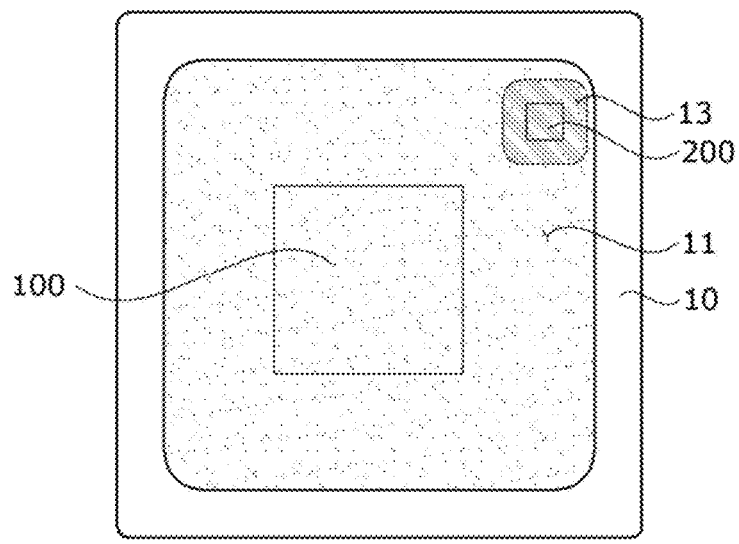
[FIGURE 16]
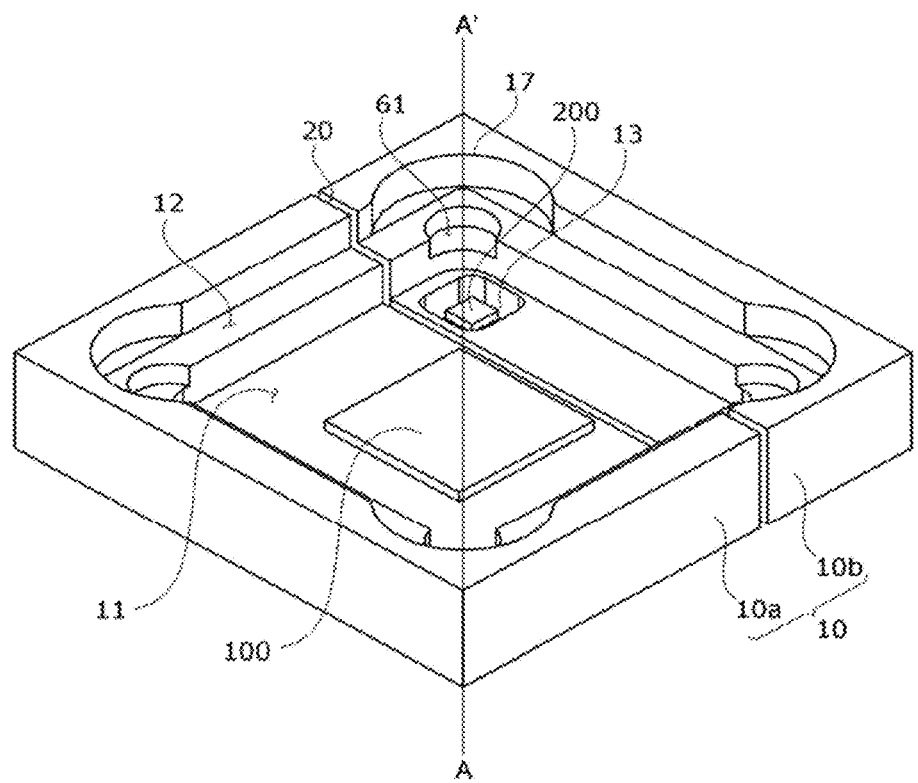

[FIGURE 17]
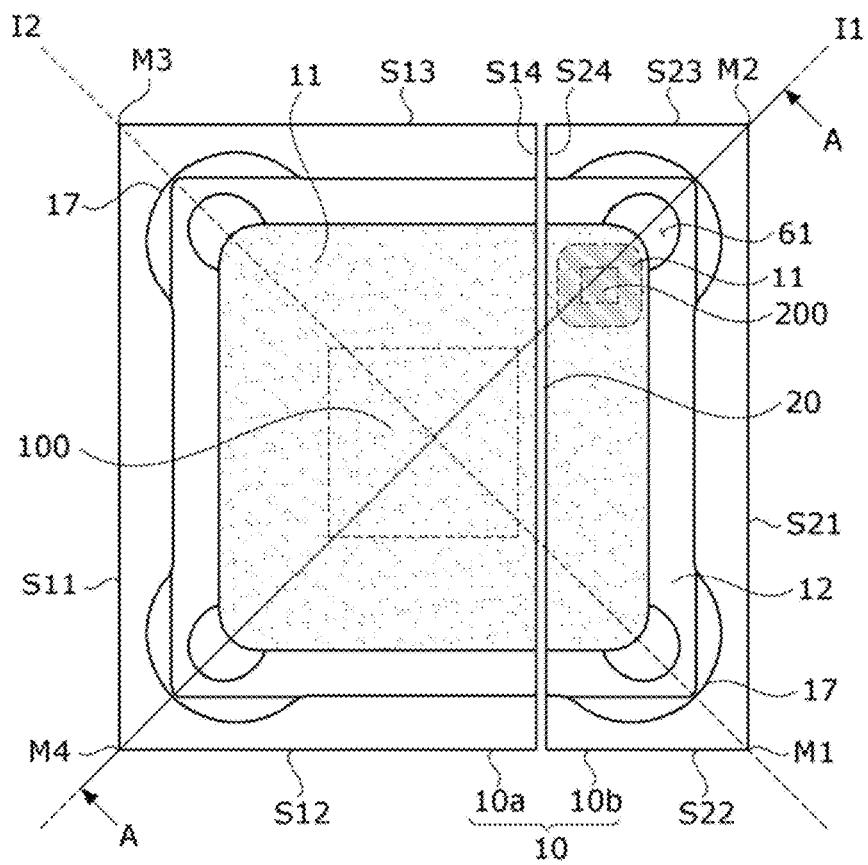
[FIGURE 18]
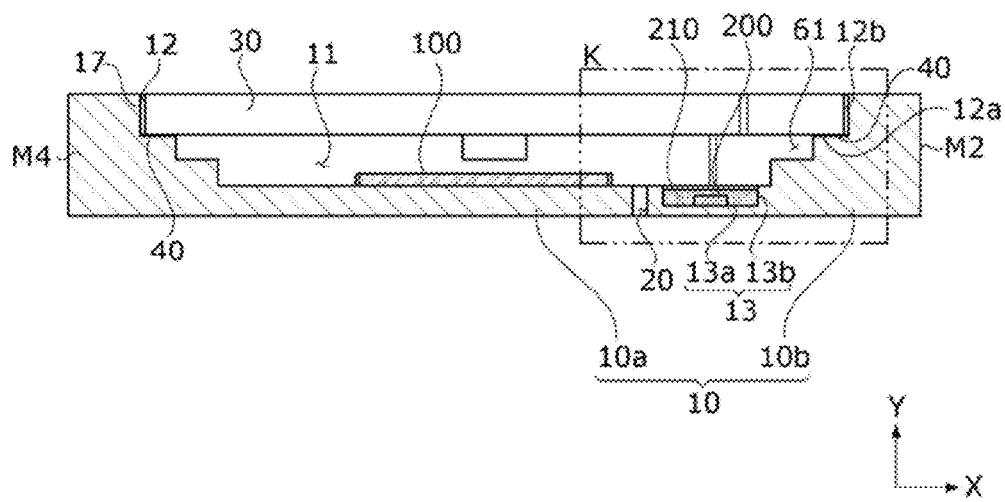

[FIGURE 19]
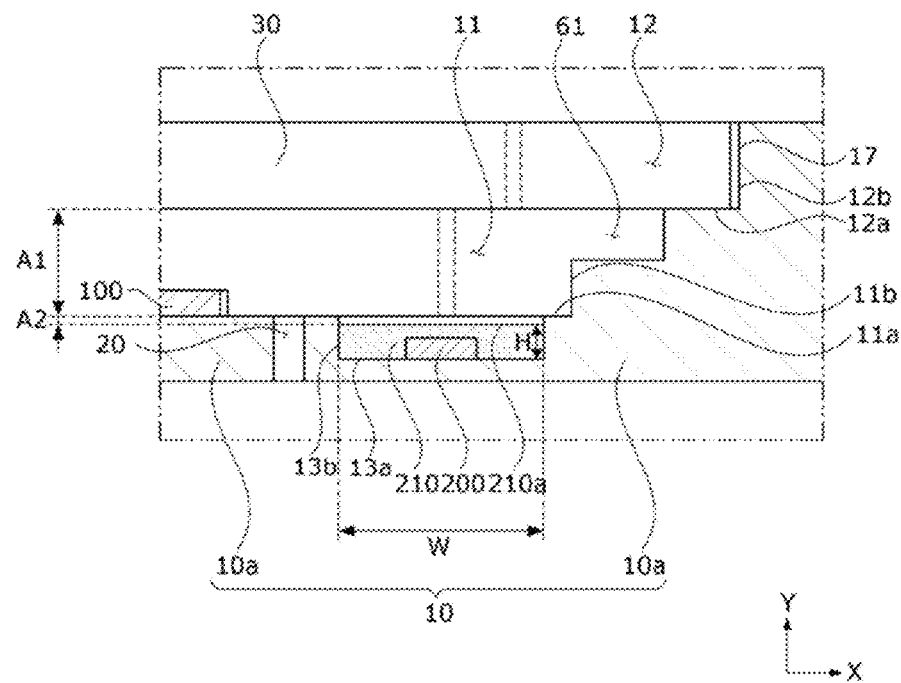
[FIGURE 20]
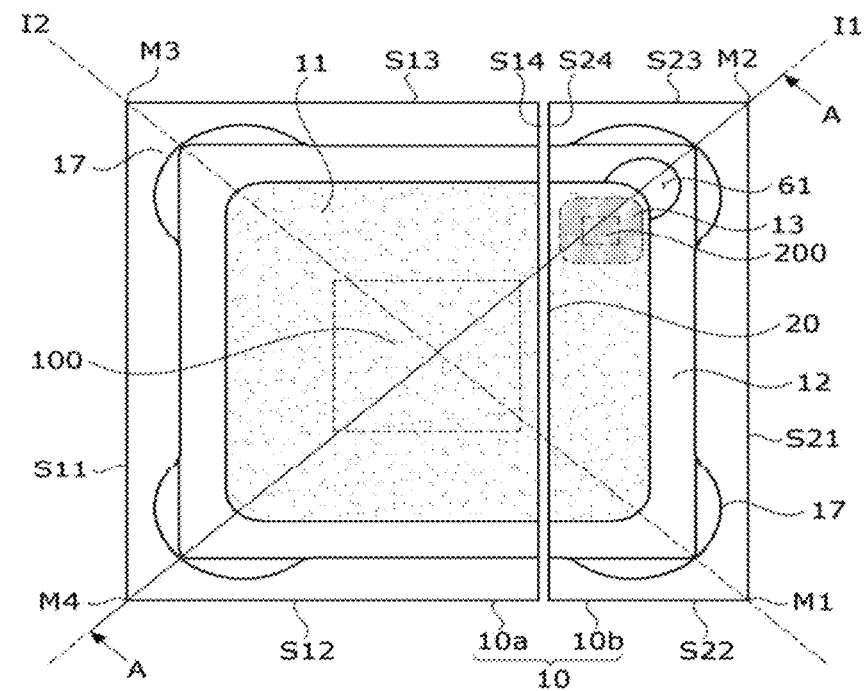

[FIGURE 21]
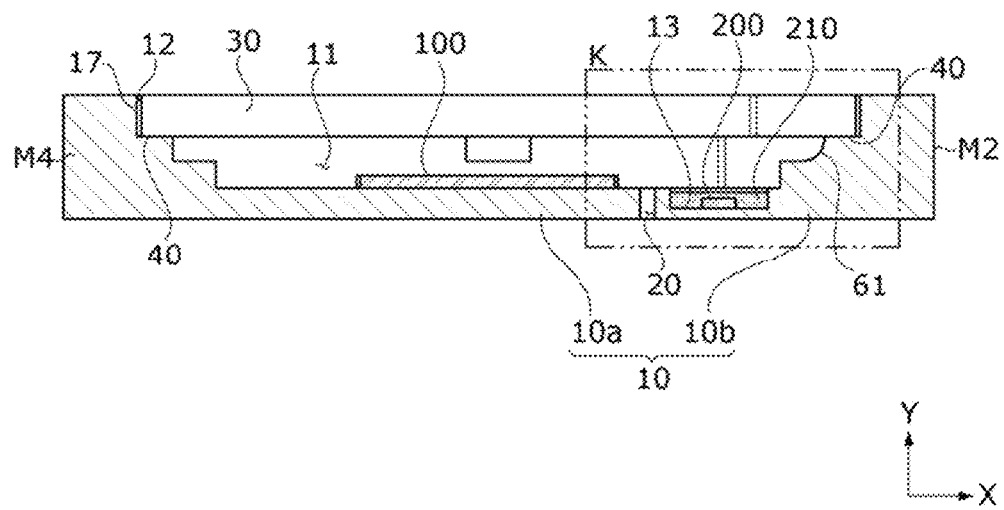
[FIGURE 22]
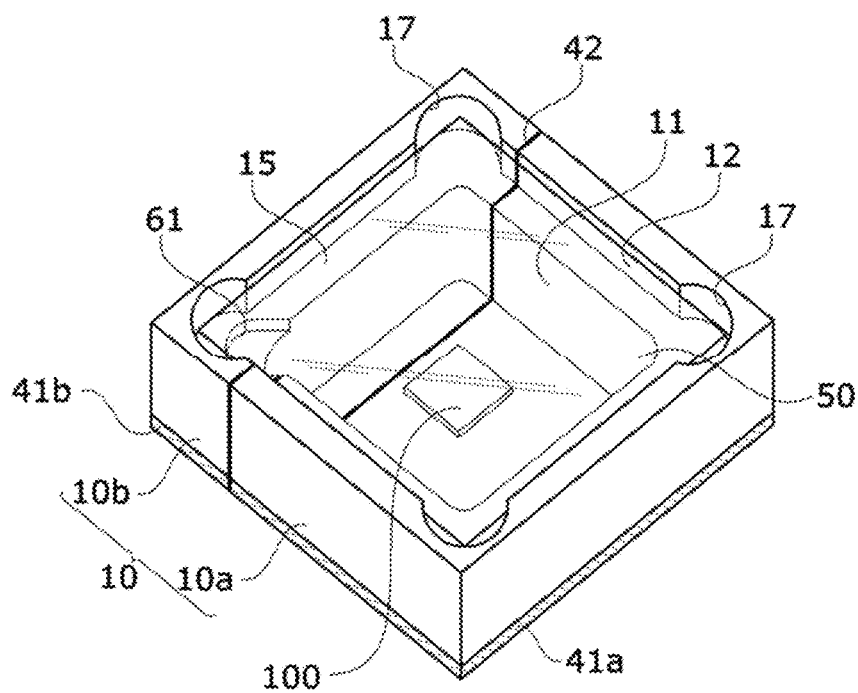

[FIGURE 23]
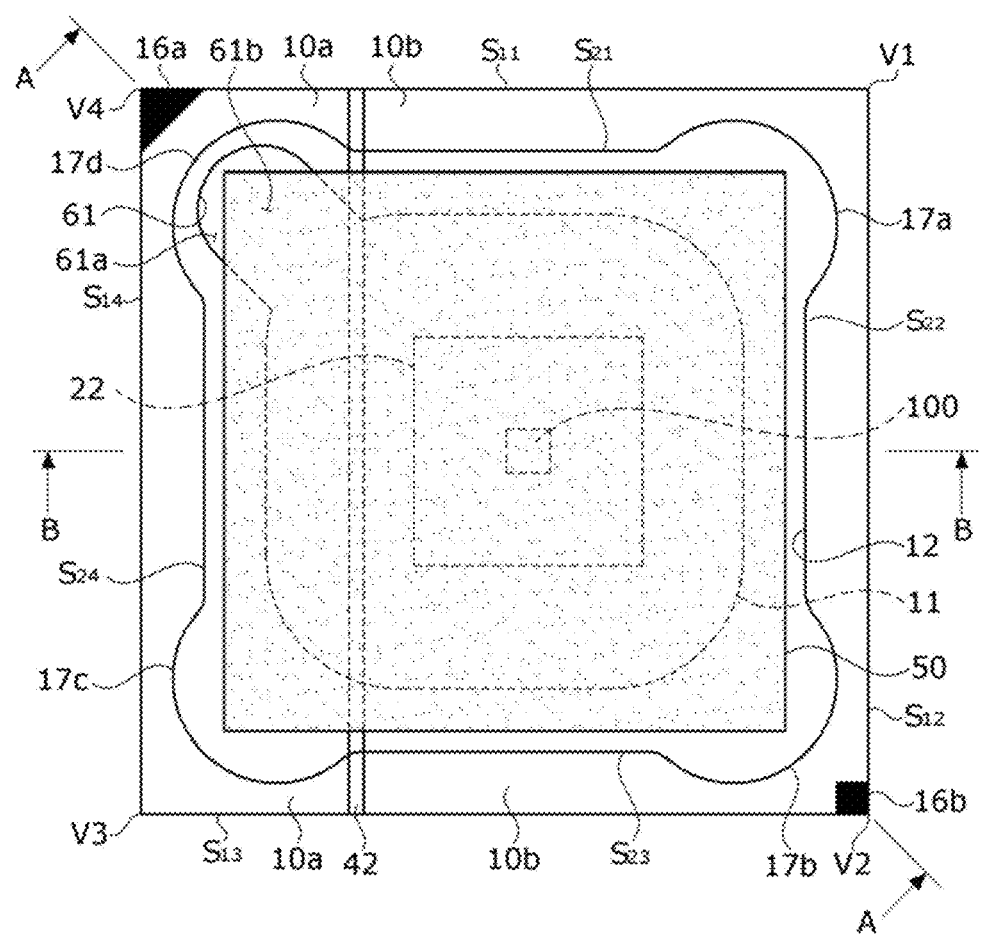

[FIGURE 24]
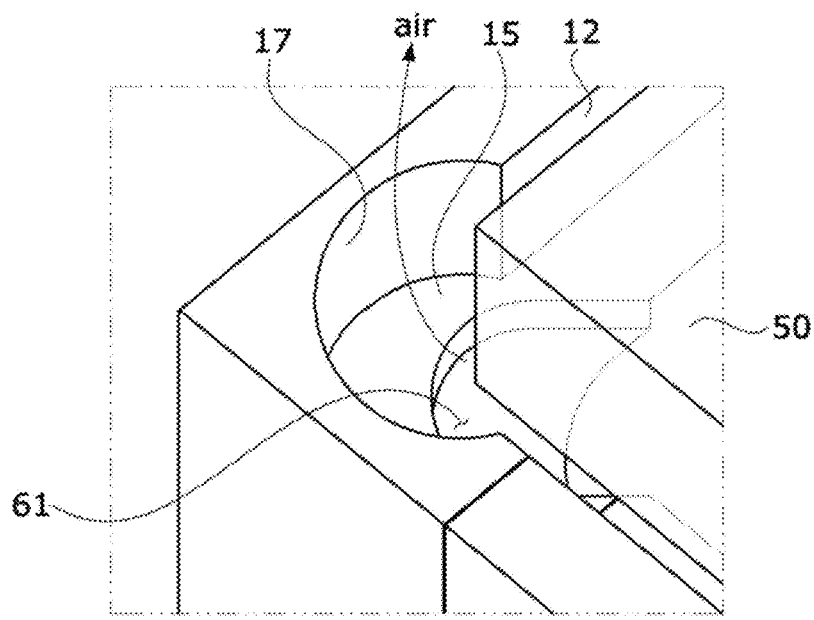
[FIGURE 25]
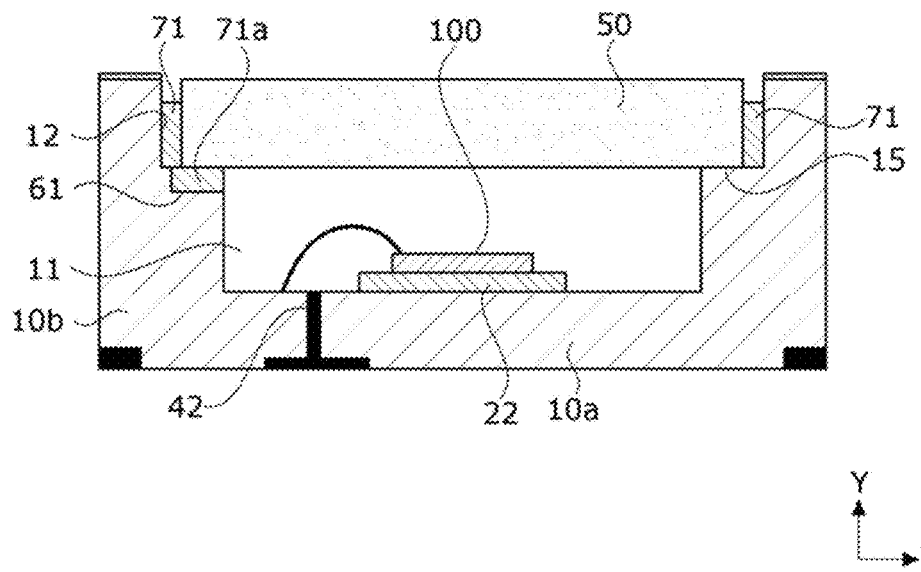

[FIGURE 26A]
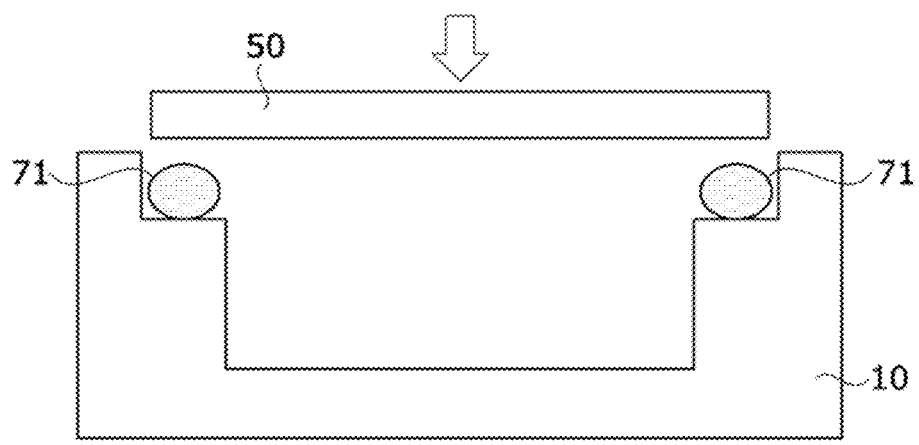
[FIGURE 26B]
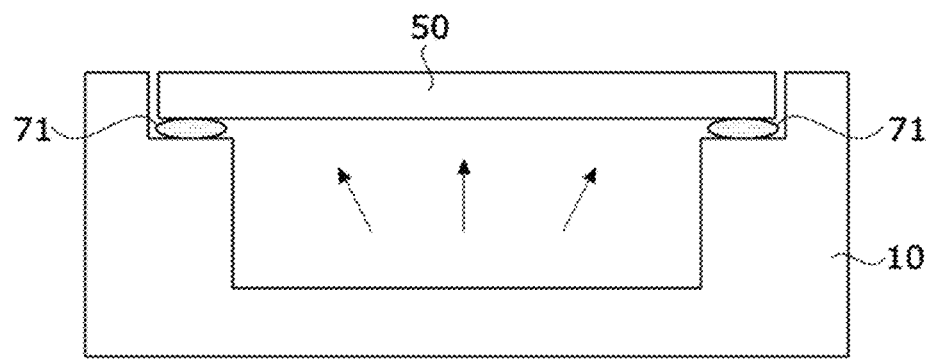

[FIGURE 27]
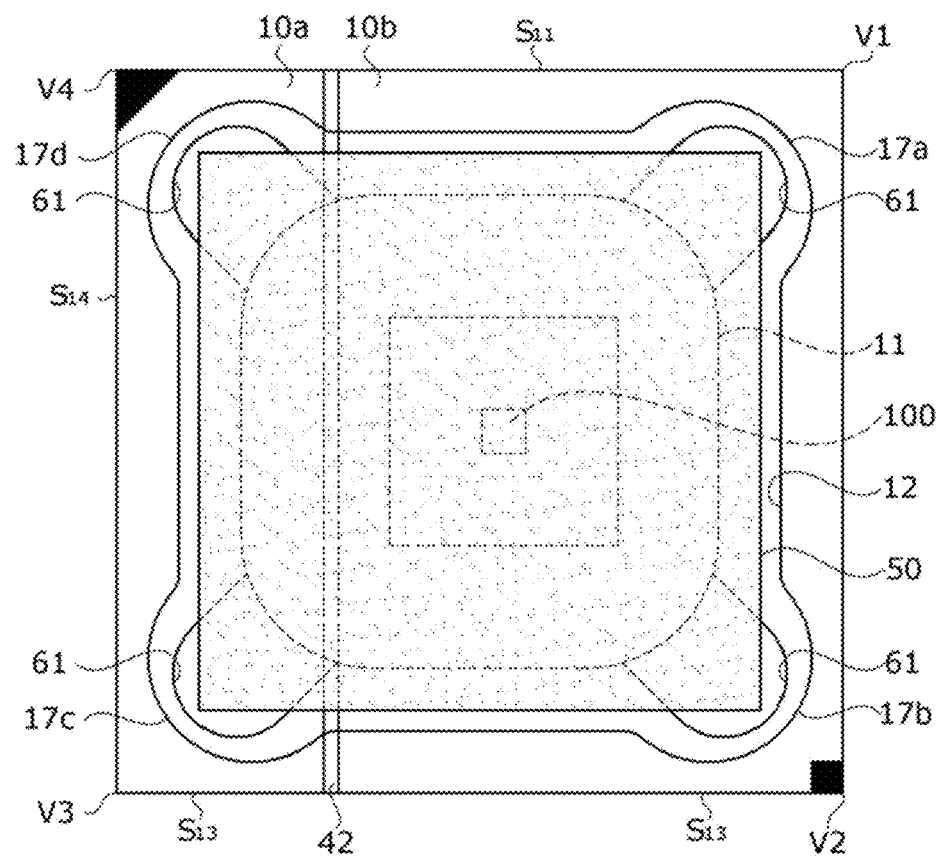

[FIGURE 28]
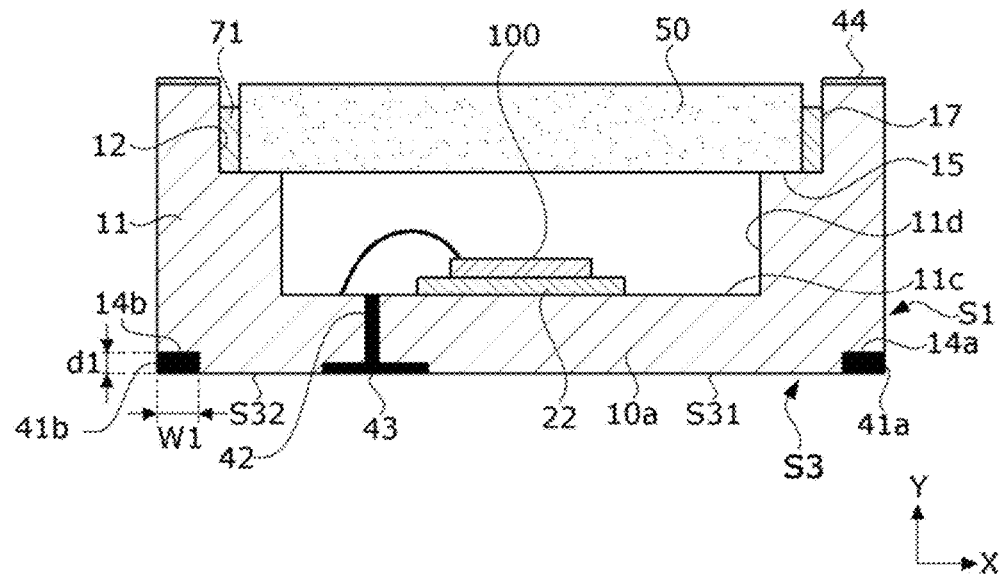
[FIGURE 29]
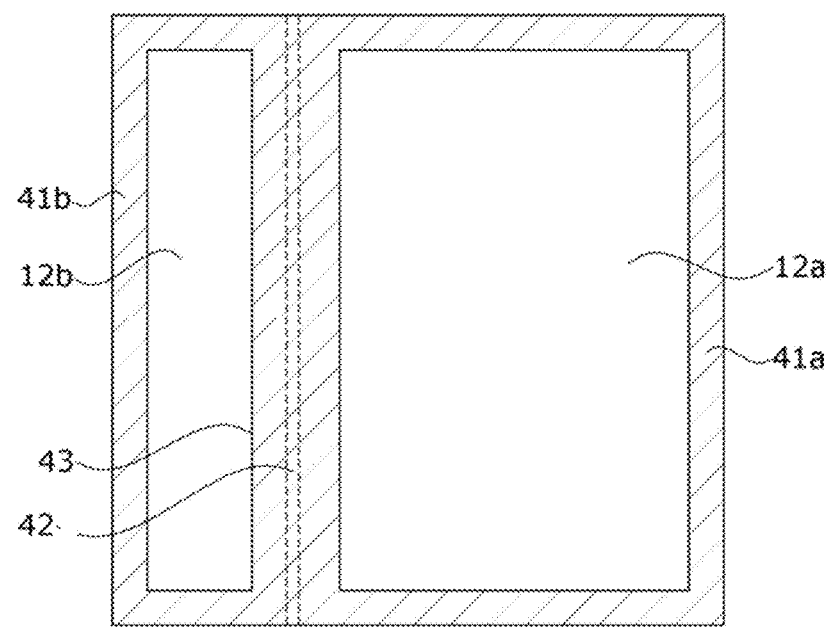

[FIGURE 30A]
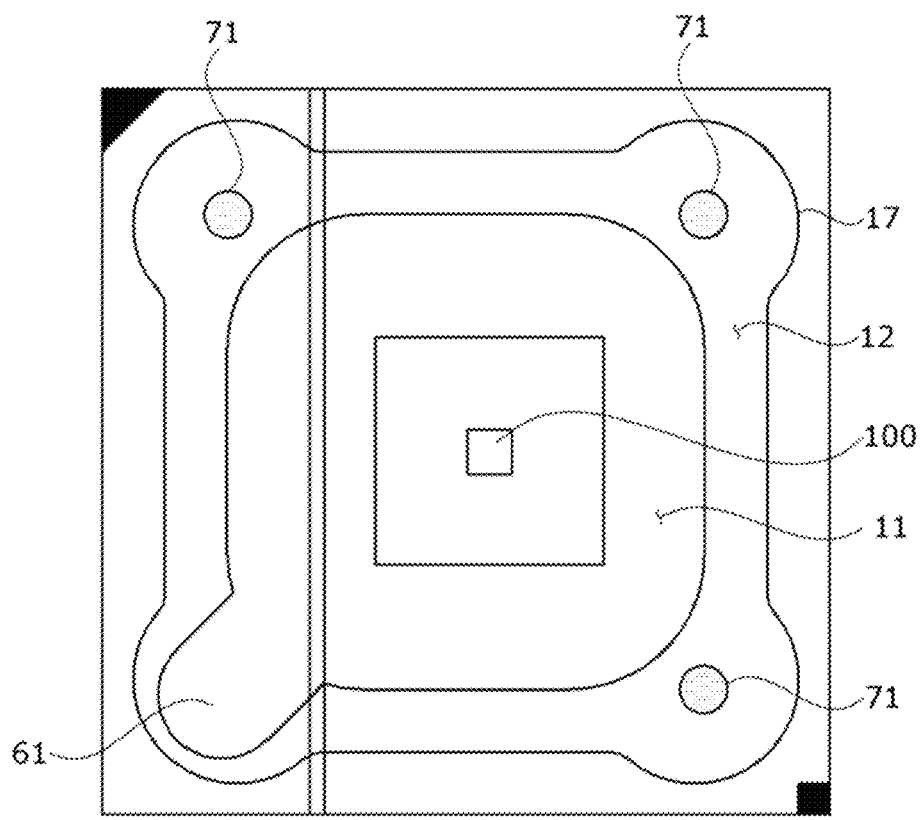

[FIGURE 30B]
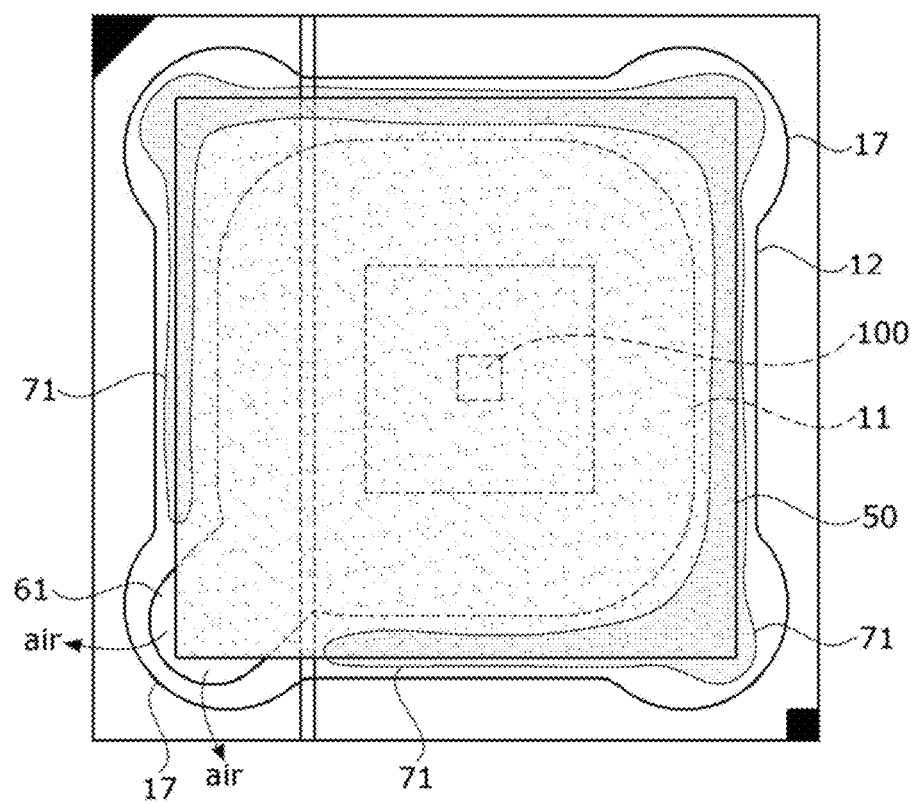

[FIGURE 30C]
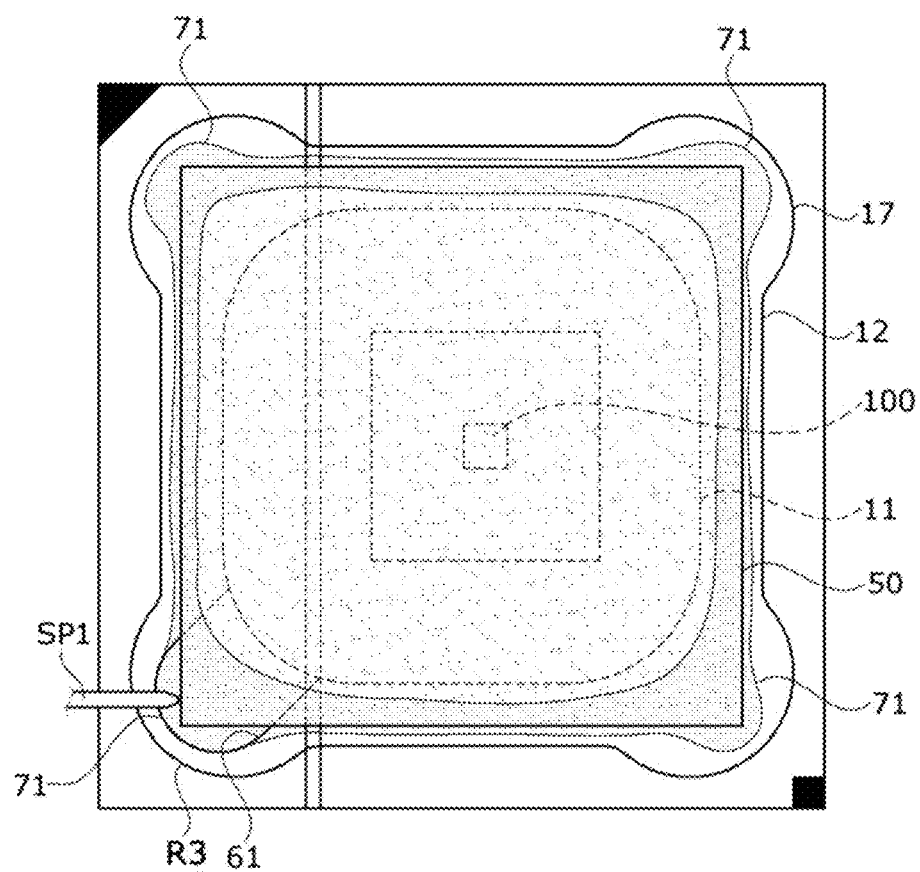

SEMICONDUCTOR DEVICE PACKAGE

CROSS REFERENCE TO RELATED APPLICATIONS

This application is the National Phase of PCT/KR2019/002838 filed on Mar. 12, 2019, which claims priority under 35 U.S.C. § 119(a) to Patent Application Nos. 10-2018-0029187, 10-2018-0029188, and 10-2018-0029189 filed in the Republic of Korea on Mar. 13, 2018, all of which are hereby expressly incorporated by reference into the present application.

TECHNICAL FIELD

Embodiments relate to a semiconductor device package.

BACKGROUND ART

A semiconductor device including a compound, such as GaN and AlGaN, has many advantages, such as wide and adjustable band-gap energy, and thus may be diversely used for light-emitting devices, light-receiving devices, various diodes, and the like.

In particular, a light-emitting device, such as a light-emitting diode or a laser diode, using a III-V group or II-VI group compound semiconductor material can realize various colors, such as red, green, blue, or ultraviolet rays due to the development of thin-film growth technology and device materials. Also, the light-emitting device can realize efficient white light by using a fluorescent material or combining colors and has the advantages of low power consumption, semi-permanent lifetime, fast response time, safety, and environmental friendliness as compared to existing light sources such as fluorescent lamps and incandescent lamps.

Moreover, due to the development of device materials, when a light-receiving device, such as a photodetector or a solar cell, is fabricated using a III-V group or II-VI group compound semiconductor material, the light-receiving device generates a photocurrent by absorbing light in various wavelength regions, and thus it is possible to use light in various wavelength regions from a gamma-ray region to a radio-wave region. Also, the light-receiving device has the advantages of fast response time, safety, environmental friendliness, and ease of adjustment of device materials and thus may be easily used for power control or ultra-high frequency circuits or communication modules.

Accordingly, the applications of semiconductor devices are being expanded to transmission modules of optical communication means, light-emitting diode backlights which replace cold cathode fluorescent lamps (CCFLs) constituting the backlights of liquid crystal display (LCD) devices, white light-emitting diode lighting devices which may replace fluorescent lamps or incandescent lamps, vehicle headlights, traffic lights, sensors for sensing gas or fire, and the like. Also, the applications of semiconductor devices may be expanded to high-frequency application circuits, other power control devices, and communication modules.

In particular, a light-emitting device that emits light in an ultraviolet wavelength band may perform a curing or sterilizing action and may be used for curing, medical, and sterilizing purposes.

However, since human eyes cannot see the light in an ultraviolet wavelength band well, there is a problem in that it is difficult to visually confirm whether a light source is operating normally.

DISCLOSURE

Technical Problem

An embodiment is directed to providing a semiconductor device package that allows whether an ultraviolet light-emitting device is operating to be visually confirmed.

An embodiment is also directed to providing a semiconductor device package that allows internal air pressure to be adjusted.

An embodiment is also directed to providing a semiconductor device package with high heat dissipation.

Objectives to be solved by the embodiment are not limited to the above-described objective and will include objectives and effectiveness which may be identified by solutions for the objectives and the embodiments described below.

Technical Solution

One aspect of the present invention provides a semiconductor device package including a body including a cavity, a semiconductor device disposed in the cavity, a light-transmitting member disposed on the cavity, and an adhesive layer configured to fix the light-transmitting member to the body, wherein the semiconductor device generates light in an ultraviolet wavelength band, and the adhesive layer includes a polymer resin, and wavelength conversion particles that absorb light in the ultraviolet wavelength band and generate light in a visible wavelength band.

The cavity may include a stepped portion on which the light-transmitting member is disposed, and the adhesive layer may be disposed on the stepped portion.

In the wavelength conversion particles in the adhesive layer, the number of wavelength conversion particles disposed on an outer side based on a center of a width of the stepped portion in a radial direction may be greater than the number of wavelength conversion particles disposed on an inner side based on the center of the width.

A height of the wavelength conversion particle, which is disposed highest at the center of the width of the stepped portion in the radial direction, may be 80% or less of a thickness of the adhesive layer.

The body may include a first conductive portion, a second conductive portion, and an insulating layer disposed between the first conductive portion and the second conductive portion.

The wavelength conversion particles may be included in an amount of 5 to 60 parts by weight based on 100 parts by weight of the polymer resin.

The stepped portion may include a plurality of side surfaces, a plurality of corners each connecting adjacent side surfaces of the plurality of side surfaces to each other, a plurality of recesses disposed at the plurality of corners, respectively, and a first groove disposed on a bottom surface of at least one of the plurality of recesses.

The first groove may be connected to the cavity through a sidewall of the cavity.

The first groove may include a first region overlapping the light-transmitting member in a vertical direction and a second region not overlapping the light-transmitting member in the vertical direction.

The stepped portion may include a first side surface and a third side surface facing each other, a second side surface and a fourth side surface facing each other, a first corner at which the first side surface is connected to the second side surface, a second corner at which the second side surface is connected to the third side surface, a third corner at which the third side surface is connected to the fourth side surface, a fourth corner at which the fourth side surface is connected to the first side surface, and a first recess, a second recess, a third recess, and a fourth recess which are disposed in the first to fourth corners, respectively.

The body may include a first outer side surface and a third outer side surface opposite to each other, a second outer side surface and a fourth outer side surface opposite to each other, a fifth corner at which the first outer side surface is connected to the second outer side surface, a sixth corner at which the second outer side surface is connected to the third outer side surface, a seventh corner at which the third outer side surface is connected to the fourth outer side surface, and an eighth corner at which the fourth outer side surface is connected to the first outer side surface, the first recess may extend toward the fifth corner, the second recess may extend toward the sixth corner, the third recess may extend toward the seventh corner, and the fourth recess may extend toward the eighth corner.

The stepped portion may further include a first groove disposed in at least one of the second to fourth recesses.

The adhesive layer may include a first adhesive portion filled in the first groove.

Another aspect of the present invention provides a semiconductor device package including a body including a first cavity, a second cavity, and a third cavity, a first semiconductor device disposed in the first cavity, a second semiconductor device disposed in the third cavity, a light-transmitting member disposed on the body, and an adhesive layer configured to fix the light-transmitting member to the body, wherein the first cavity may include a first groove disposed between an outer circumferential surface of the body and the first semiconductor device, the second cavity may be disposed above the first cavity, the third cavity may be disposed on a connection line connecting the first groove to the first semiconductor device, the third cavity may be positioned at a lower portion of the body than the first cavity, the first semiconductor device may output light having an ultraviolet wavelength band as a peak wavelength, the second semiconductor device may output light having a visible wavelength band as a peak wavelength, and the adhesive layer may include a polymer resin, and wavelength conversion particles that absorb light in the ultraviolet wavelength band and generate light in the visible wavelength band.

The first groove may protrude toward a corner of the body from the outer circumferential surface of the first cavity.

A ratio of a height of the third cavity to a width of the third cavity may be in a range of 1:2 to 1:5.

The semiconductor device package may further include a phosphor layer disposed in the third cavity, wherein the phosphor layer may surround the second semiconductor device, have an upper surface disposed further downward than a lower surface of the first cavity, and output light having a peak wavelength different from that of light output from the second semiconductor device in the visible wavelength band.

The body may include a first conductive portion, a second conductive portion, and an insulating portion disposed between the first conductive portion and the second conductive portion, the first semiconductor device may be electrically connected to the first conductive portion and the second conductive portion, and the second semiconductor device may be electrically connected to the first conductive portion and the second conductive portion.

The wavelength conversion particles may be included in an amount of 5 to 60 parts by weight based on 100 parts by weight of the polymer resin.

The first groove may include a first region overlapping the light-transmitting member in a vertical direction and a second region not overlapping the light-transmitting member in the vertical direction.

Advantageous Effects

According to embodiments, it is possible to visually confirm whether an ultraviolet light-emitting device operates.

According to embodiments, it is possible to reduce an adhesion failure of a light-transmitting member since internal air pressure can be adjusted.

Further, it is possible to improve heat dissipation efficiency of a semiconductor device package.

Various advantages and effects of the present invention are not limited to the above description and can be more easily understood through the description of specific exemplary embodiments of the present invention.

DESCRIPTION OF DRAWINGS

FIG. 1 is a conceptual diagram of a semiconductor device package according to a first embodiment of the present invention.

FIG. 2 is an enlarged view of portion A in FIG. 1.

FIG. 3 is a view illustrating a modified example of FIG. 2.

FIG. 4 is a view illustrating a state in which wavelength conversion particles of an adhesive layer absorb light in an ultraviolet wavelength band and generate visible light.

FIG. 5 is a conceptual diagram of a semiconductor device according to one embodiment of the present invention.

FIG. 6 is a view illustrating a modified example of FIG. 5.

FIG. 7 is a plan view of a semiconductor device package according to a second embodiment of the present invention.

FIG. 8 is a cross-sectional view of the semiconductor device package according to the second embodiment of the present invention.

FIG. 9 is a plan view of a semiconductor device package according to a third embodiment of the present invention.

FIG. 10 is a cross-sectional view of the semiconductor device package according to the third embodiment of the present invention.

FIG. 11 is a plan view of a semiconductor device package according to a fourth embodiment of the present invention.

FIG. 12 is a cross-sectional view of the semiconductor device package according to the fourth embodiment of the present invention.

FIG. 13 is a flowchart for describing a method of manufacturing the semiconductor device package according to one embodiment of the present invention.

FIG. 14 is a view for describing an operation of rotating the semiconductor device package.

FIGS. 15A and 15B are a schematic cross-sectional view and a plan view of a semiconductor device package according to a fifth embodiment of the present invention, respectively.

FIG. 16 is a perspective view of a semiconductor device package according to a sixth embodiment of the present invention.

FIG. 17 is a plan view of the semiconductor device package according to the sixth embodiment of the present invention.

FIG. 18 is a cross-sectional view of the semiconductor device package according to the sixth embodiment of the present invention.

FIG. 19 is an enlarged view of portion K in FIG. 18.

FIG. 20 is a cross-sectional view of a semiconductor device package according to a seventh embodiment of the present invention.

FIG. 21 is a view illustrating a modified example of FIG. 18.

FIG. 22 is a conceptual diagram of a semiconductor device package according to an eighth embodiment of the present invention.

FIG. 23 is a plan view of FIG. 22.

FIG. 24 is a partially enlarged view of FIG. 22.

FIG. 25 is a cross-sectional view taken along line A-A in FIG. 23.

FIGS. 26A and 26B are views for describing a problem in which an adhesion failure of a light-transmitting member occurs due to internal air pressure in a case in which a discharge groove is not present.

FIG. 27 is a view illustrating a modified example of FIG. 23.

FIG. 28 is a cross-sectional view taken along line B-B in FIG. 23.

FIG. 29 is a bottom view of FIG. 22.

FIGS. 30A to 30C are views illustrating a method of fixing a light-transmitting member.

MODES OF THE INVENTION

The present embodiments may be modified in other forms, or several embodiments may be combined with one another, and the scope of the present invention is not limited to each of the embodiments described below.

Even when content described in a specific embodiment is not described in other embodiments, the content may be understood as being related to other embodiments unless described otherwise or unless the content contradicts a specific embodiment in the other embodiments.

For example, when features of component A are described in a specific embodiment and features of component B are described in another embodiment, it should be understood that embodiments in which component A is combined with component B fall within the scope and spirit of the present invention even when they are not explicitly described, unless there is an opposing or contradictory explanation.

In the description of the embodiments, when an element is referred to as being "on or under" another element, the term "on or under" refers to either a direct connection between two elements or an indirect connection between two elements having one or more elements formed therebetween. In addition, when the term "on or under" is used, it may refer to a downward direction as well as an upward direction with respect to an element.

Hereinafter, embodiments of the present invention will be described in detail with reference to the accompanying drawings so that those of ordinary skill in the art can easily implement them.

FIG. 1 is a conceptual diagram of a semiconductor device package according to a first embodiment of the present invention, FIG. 2 is an enlarged view of portion A in FIG. 1, FIG. 3 is a view illustrating a modified example of FIG. 2, and FIG. 4 is a view illustrating a state in which wavelength conversion particles of an adhesive layer absorb light in an ultraviolet wavelength band and generate visible light.

Referring to FIG. 1, the semiconductor device package according to the embodiment may include bodies 10a and 10b including a cavity 11, a semiconductor device 100 disposed in the cavity 11, and a light-transmitting member 50 disposed on the cavity 11.

The bodies 10a and 10b may be manufactured by processing an aluminum substrate. Accordingly, both of an inner surface and an outer surface of the bodies 10a and 10b according to the embodiment may have conductivity. Such a structure may have various advantages. In a case in which a non-conductive material, such as AlN or $Al_2O_3$, is used for the bodies 10a and 10b, a reflectivity thereof in an ultraviolet wavelength band ranges only from 20% to 40%, and thus there is a problem in that a separate reflective member should be disposed. In addition, a separate conductive member such as a lead frame and a circuit pattern may be necessary. Accordingly, manufacturing costs may be increased and a process may be complicated. In addition, a conductive member such as gold (Au) has a problem of absorbing ultraviolet light so that light extraction efficiency is decreased.

However, according to the embodiment, since the bodies 10a and 10b themselves are made of aluminum and thus have a high reflectivity in an ultraviolet wavelength band, the separate reflective member may be omitted. In addition, since the bodies 10a and 10b themselves have conductivity, the separate circuit pattern and lead frame may be omitted. In addition, since the bodies 10a and 10b are made of aluminum, the bodies 10a and 10b may have a high thermal conductivity ranging from 140 W/m·K to 160 W/m·K. Accordingly, heat dissipation efficiency may be improved.

The bodies 10a and 10b may include a first conductive portion 10a and a second conductive portion 10b. A first insulating portion 42 may be disposed between the first conductive portion 10a and the second conductive portion 10b. Since both of the first conductive portion 10a and the second conductive portion 10b have conductivity, the first insulating portion 42 should be disposed so as to separate poles.

The first insulating portion 42 may include all of various materials having an insulating function. As an example, the material of the first insulating portion 42 may be selected from among an epoxy molding compound (EMC), white silicone, a photoimageable solder resist (PSR), a silicone resin composition, a modified epoxy resin composition such as a silicone modified epoxy resin, a modified silicone resin composition such as an epoxy modified silicone resin, a polyimide resin composition, a modified polyimide resin composition, and a resin such as polyphthalamide (PPA), a polycarbonate resin, polyphenylene sulfide (PPS), a liquid crystal polymer (LCP), an acrylonitrile butadiene styrene (ABS) resin, a phenol resin, an acrylic resin, a polybutylene terephthalate (PBT) resin, and the like.

The first insulating portion 42 may have a thickness of 10 μm to 100 μm. In a case in which the thickness is 10 μm or more, the first conductive portion 10a and the second conductive portion 10b may be sufficiently insulated from each other, and in a case in which the thickness is 70 μm or less, a problem of increasing a size of the package may be reduced.

However, a structure of the body is not necessarily limited thereto, and the body may also be manufactured by stacking a plurality of insulating structures such as AlN or $Al_2O_3$. In this case, a separate circuit pattern may be provided in the body.

The cavity 11 may include a first cavity 11 in which the semiconductor device 100 is disposed and a second cavity 12 in which the light-transmitting member 50 is disposed. The first cavity 11 may be smaller in diameter than the second cavity 12. Accordingly, a stepped portion 15 may be formed between the first cavity 11 and the second cavity 12.

In the first cavity 11, a side surface may be disposed to be perpendicular to a bottom surface. However, the side surface is not necessarily limited thereto and may be disposed to have an inclination angle greater than 90° with respect to the bottom surface and may reflect light emitted from the semiconductor device 100 upward. As described above, since the bodies 10a and 10b are made of aluminum, an inner surface of the cavity 11 may reflect light in an ultraviolet wavelength band upward even without a separate reflective member. However, the present invention is not necessarily limited thereto, and a separate reflective member may be further disposed.

The second cavity 12 may be disposed above the first cavity 11 and may have a diameter allowing the light-transmitting member 50 to be disposed.

The semiconductor device 100 may be disposed in the cavity 11. The semiconductor device 100 may be electrically connected to the first conductive portion 10a and the second conductive portion 10b. A submount (not shown) may be disposed in the cavity 11, and the semiconductor device 100 may be disposed on the submount. A pad (not shown) to which a wire is bonded may be disposed on a bottom of the cavity 11.

The semiconductor device 100 may output light in an ultraviolet wavelength band. As an example, the semiconductor device 100 may also output light in a near-ultraviolet wavelength band (UV-A), light in a far-ultraviolet wavelength band (UV-B), or light in a deep-ultraviolet wavelength band (UV-C). The wavelength range may be determined by an aluminum (Al) composition ratio of a light-emitting structure.

As an example, the UV-A may have a peak wavelength in a range of 320 nm to 420 nm, the UV-B may have a peak wavelength in a range of 280 nm to 320 nm, and the UV-C may have a peak wavelength in a range of 100 nm to 280 nm.

The light-transmitting member 50 may be disposed on the cavity 11. The light-transmitting member 50 may be supported by the stepped portion 15 disposed between the first cavity 11 and the second cavity 12. An adhesive layer 60 may be disposed between the stepped portion 15 and the light-transmitting member 50.

A material of the light-transmitting member 50 is not specifically limited as long as it is a material capable of transmitting light in an ultraviolet wavelength band. As an example, the light transmitting layer may include an optical material such as quartz having a high light transmittance in an ultraviolet wavelength, but the present invention is not limited thereto.

Referring to FIG. 2, the adhesive layer 60 may include a polymer resin 63, and wavelength conversion particles 62 that absorb light in an ultraviolet wavelength band and generate light in a visible wavelength band.

The type of the polymer resin 63 is not specifically limited. The polymer resin 63 may be one or more among an epoxy resin, a silicone resin, a polyimide resin, a urea resin, and an acrylic resin. As an example, the polymer resin 63 may be a silicone resin or an epoxy resin.

The wavelength conversion particles 62 may absorb ultraviolet light emitted from the semiconductor device 100 and convert the ultraviolet light into visible light. For example, the wavelength conversion particles 62 may include one or more among a phosphor, a quantum dot (QD), and a fluorescent dye.

The phosphor may include one fluorescent material among a terbium aluminum garnet (TAG)-based fluorescent material, a silicate-based fluorescent material, a sulfide-based fluorescent material, and a nitride-based fluorescent material, but the type of the phosphor of the embodiment is not specifically limited. As an example, the phosphor may be one among a blue phosphor, a green phosphor, and a red phosphor.

In addition, the sulfide-based phosphor may be selected from among (Ca, Sr)S: Eu and $(Sr,Ca,Ba)(Al,Ga)_2S_4$:Eu, and the nitride-based phosphor may be (Sr, Ca, Si, Al, O)N:Eu (for example, $CaAlSiN_4$:Eu β-SiAlON:Eu), or $(Ca_x, M_y)(Si,Al)_{12}(O,N)_{16}$ which is a Ca-α SiAlON:Eu-based phosphor. Here, M is at least one material among Eu, Tb, Yb, and Er, and may be selected from among phosphor components satisfying $0.05<(x+y)<0.3$, $0.02<x<0.27$, and $0.03<y<0.3$.

The red phosphor may be a nitride-based phosphor including N (for example, $CaAlSiN_3$:Eu) or a $KSF(K_2SiF_6)$ phosphor.

The wavelength conversion particles 62 may be included in an amount of 5 to 60 parts by weight based on 100 parts by weight of the polymer resin. When the wavelength conversion particles 62 are included in an amount less than 5 parts by weight, the efficiency of being converted into visible light may be small, and thus it may be difficult to visually observe the wavelength conversion particles 62. In addition, when the wavelength conversion particles 62 are included in an amount greater than 60 parts by weight, the amount of the wavelength conversion particles 62 becomes too great such that an adhesive property may be deteriorated, and cracks may occur when the wavelength conversion particles 62 are irradiated with ultraviolet light for a long time.

Referring to FIG. 3, a great amount of wavelength conversion particles 62 may be distributed outwardly. In addition, the wavelength conversion particles 62 may be distributed mainly in a lower portion of the adhesive layer 60. Such a configuration may be controlled by rotating the bodies 10a and 10b at high speed when the polymer resin is cured. When the bodies 10a and 10b are rotated at high speed before the polymer resin 63 is fully cured, the wavelength conversion particles 62 may be precipitated or may be disposed to be biased outward.

Specifically, in the wavelength conversion particles 62 in the adhesive layer 60, the number (or density) of wavelength conversion particles 62 disposed on an outer side based on a center C1 of a width W1 of the stepped portion 15 in a radial direction may be greater than the number (or density) of wavelength conversion particles 62 disposed on an inner side based on the center C1.

Further, a height H1 of the wavelength conversion particle 62, which is disposed highest at the center C1 of the width W1 of the stepped portion 15 in the radial direction, among the wavelength conversion particles 62 in the adhesive layer 60 disposed below the light-transmitting member 50 may be 80% or less of a thickness H1+H2 of the adhesive layer 60. In addition, when the adhesive layer 60 disposed below the light-transmitting member 50 is bisected in a thickness direction and divided into an upper layer H1 and a lower layer H2, the number (or density) of the wavelength conversion particles 62 may be greater in the lower layer H2 than in the upper layer H1.

According to such a configuration, since the wavelength conversion particles 62 are not disposed on an upper portion of the adhesive layer 60, there is an effect of improving adhesion to the light-transmitting member 50. At this point, when the above-described parts by weight of the wavelength conversion particles 62 are satisfied, the effect may be further increased.

When the adhesive layer 60 disposed below the light-transmitting member 50 is divided into four regions F1, F2, F3, and F4 based on the center C1 of the width W1 and a boundary line between the upper layer H1 and the lower layer H2, the number (or density) of the wavelength conversion particles 62 may be the greatest in a third region F3, followed by a second region F2, a fourth region F4, and a first region F1.

Referring to FIG. 4, when the ultraviolet semiconductor device 100 is turned on, the wavelength conversion particles 62 of the adhesive layer 60 may absorb a part of ultraviolet light and emit light. Accordingly, a user may visually confirm that the ultraviolet semiconductor device 100 is turned on.

FIG. 5 is a conceptual diagram of the semiconductor device according to one embodiment of the present invention, and FIG. 6 is a view illustrating a modified example of FIG. 5.

Referring to FIG. 5, the semiconductor device 100 according to the embodiment may be mounted on a submount 22 in a flip chip manner. That is, a first electrode 152 and a second electrode 151 of the semiconductor device 100 may be mounted on a first pad 23a and a second pad 23b of the submount 22 in a flip chip manner. Here, the first pad 23a and the second pad 23b may be respectively soldered to bodies 10a and 10b with wires W.

However, a method of mounting the semiconductor device 100 is not particularly limited. For example, as shown in FIG. 6, a substrate 110 of the semiconductor device 100 is disposed on the submount 22, and the first electrode 152 and the second electrode 151 may be directly soldered to the bodies 10a and 10b.

The semiconductor device 100 according to the embodiment may include the substrate 110, a first conductive semiconductor layer 120, an active layer 130, and a second conductive semiconductor layer 140. The semiconductor layers may each include an aluminum composition so as to emit light in an ultraviolet wavelength band.

The substrate 110 includes a conductive substrate or an insulating substrate. The substrate 110 may be a material suitable for growing a semiconductor material or may be a carrier wafer. The substrate 110 may be made of a material selected from the group consisting of sapphire ($Al_2O_3$), SiC, GaAs, GaN, ZnO, Si, GaP, InP, and Ge, but the present invention is not limited thereto. As necessary, the substrate 110 may be removed.

A buffer layer (not shown) may be further provided between the first conductive semiconductor layer 120 and the substrate 110. The buffer layer may mitigate the lattice mismatch between a light-emitting structure 160 provided on the substrate 110 and the substrate 110.

The first conductive semiconductor layer 120 may be implemented with a compound semiconductor including a III-V group element, a II-VI group element, or the like and may be doped with a first dopant. The first conductive semiconductor layer 120 may be made of semiconductor materials having a composition formula of $In_{x1}Al_{y1}Ga_{1-x1-y1}N$ ($0<=x1<=1$, $0<=y1<=1$, and $0<=x1+y1<=1$), for example, semiconductor materials selected from among AlGaN, AlN, InGaN, InAlGaN, and the like. In addition, the first dopant may be an n-type dopant such as silicon (Si), germanium (Ge), tin (Sn), selenium (Se), and tellurium (Te). When the first dopant is an n-type dopant, the first conductive semiconductor layer 120 doped with the first dopant may be an n-type semiconductor layer.

The active layer 130 is a layer at which electrons (or holes) injected through the first conductive semiconductor layer 120 and holes (or electrons) injected through the second conductive semiconductor layer 140 meet. The active layer 130 may transition to a low energy level due to the recombination of electrons and holes and emit light having a wavelength corresponding thereto.

The active layer 130 may have one structure among a single well structure, a multi-well structure, a single quantum well structure, a multi-quantum well (MQW) structure, a quantum dot structure, and a quantum wire structure, but the structure of the active layer 130 is not limited thereto.

The second conductive semiconductor layer 140 may be formed on the active layer 130 and implemented with a compound semiconductor including a III-V group element, a II-VI group element, or the like, and the second conductive semiconductor layer 140 may be doped with a second dopant. The second conductive semiconductor layer 140 may be made of semiconductor materials having a composition formula of $In_{x5}Al_{y2}Ga_{1-x5-y2}N$ ($0<=x5<=1$, $0<=y2<=1$, and $0<=x5+y2<=1$) or materials selected from among AlGaN, AlInN, AlGaAs, GaP, GaAs, GaAsP, and AlGaInP. When the second dopant is a p-type dopant, such as magnesium (Mg), zinc (Zn), calcium (Ca), strontium (Sr), and barium (Ba), the second conductive semiconductor layer 140 doped with the second dopant may be a p-type semiconductor layer.

The first electrode 152 may be electrically connected to the first conductive semiconductor layer 120, and the second electrode 151 may be electrically connected to the second conductive semiconductor layer 140. Each of the first and second electrodes 152 and 151 may be formed of a material selected from among titanium (Ti), ruthenium (Ru), rhodium (Rh), iridium (Ir), Mg, Zn, Al, indium (In), tantalum (Ta), palladium (Pd), cobalt (Co), nickel (Ni), Si, Ge, silver (Ag), Au, and selective alloys thereof.

The embodiment has been described with reference to a structure of a horizontal type light-emitting device but is not necessarily limited thereto. For example, a light-emitting device according to the embodiment may also have a vertical structure or a flip chip structure.

FIG. 7 is a plan view of a semiconductor device package according to a second embodiment of the present invention, FIG. 8 is a cross-sectional view of the semiconductor device package according to the second embodiment of the present invention, FIG. 9 is a plan view of a semiconductor device package according to a third embodiment of the present invention, FIG. 10 is a cross-sectional view of the semiconductor device package according to the third embodiment of the present invention, FIG. 11 is a plan view of a semiconductor device package according to a fourth embodiment of the present invention, and FIG. 12 is a cross-sectional view of the semiconductor device package according to the fourth embodiment of the present invention.

Referring to FIGS. 7 and 8, a wavelength conversion layer 81 may be disposed to surround a semiconductor device 100. The wavelength conversion layer 81 may include a polymer resin and wavelength conversion particles. The wavelength conversion layer 81 may absorb a part of light emitted from side surfaces of the semiconductor device 100 and emit light.

Here, the wavelength conversion layer 81 may be disposed to be spaced apart from the semiconductor device 100, but the present invention is not necessarily limited thereto. As an example, the wavelength conversion layer 81 may be filled between the semiconductor device 100 and a submount 22 to fix the semiconductor device 100 to the submount 22 while absorbing a part of ultraviolet light and emitting light.

Referring to FIGS. 9 and 10, a wavelength conversion layer 82 may be disposed on side surfaces of a cavity 11. The wavelength conversion layer 82 may include a polymer resin and wavelength conversion particles. The wavelength conversion layer 82 may absorb a part of light emitted from side surfaces of the semiconductor device 100 and emit light.

Here, a plurality of circuit patterns 115a and 115b may be disposed in the first cavity 11. That is, in a case in which a body is not made of a conductive material, separate circuit patterns may be disposed. Here, the wavelength conversion layer 82 may be disposed in a region in which the circuit patterns 115a and 115b are not disposed. The case in which the wavelength conversion layer 82 is disposed in an edge region in which the circuit patterns 115a and 115b are not disposed is illustrated as an example, but the present invention is not necessarily limited thereto. According to the embodiment, since the wavelength conversion layer 82 is formed in the region in which the circuit patterns 115a and 115b are not disposed, the risk of damage to an electrical connection of a wire during the formation of the wavelength conversion layer 82 may be reduced. However, the wavelength conversion layer 82 is not necessarily limited thereto and may be disposed on the circuit patterns 115a and 115b. In this case, the wavelength conversion layer 82 may additionally perform the role of covering and protecting the circuit patterns 115a and 115b.

Referring to FIGS. 11 and 12, a wavelength conversion layer 83 may be disposed on an entire bottom surface of a cavity 11. Here, a hole H1 for wire bonding may be disposed. According to such a structure, the entire bottom surface of the cavity 11 is turned on so that it is possible to easily confirm that an ultraviolet semiconductor device 100 is turned on even from a distance.

FIG. 13 is a flowchart for describing a method of manufacturing the semiconductor device package according to one embodiment of the present invention, and FIG. 14 is a view for describing an operation of rotating the semiconductor device package.

Referring to FIGS. 13 and 14, the method of manufacturing the semiconductor device package according to the embodiment includes: disposing a semiconductor device 100 in a cavity 11 of bodies 10a and 10b (S11); applying an adhesive layer 60 onto a stepped portion 15 of the bodies 10a and 10b and fixing a light-transmitting member 50 (S12); and rotating the bodies 10a and 10b (S13).

In the operation of disposing the semiconductor device 100 (S11), the semiconductor device 100 may be disposed in the cavity 11 and electrically connected to the bodies 10a and 10b. The bodies 10a and 10b may include a first conductive portion 10a and a second conductive portion 10b. A first insulating portion 42 may be disposed between the first conductive portion 10a and the second conductive portion 10b. Since both of the first conductive portion 10a and the second conductive portion 10b have conductivity, the first insulating portion 42 should be disposed so as to separate poles.

In the operation of fixing the light-transmitting member 50, the adhesive layer 60 may be applied onto the stepped portion 15 of the bodies 10a and 10b and the light-transmitting member 50 may be fixed. The adhesive layer 60 may include a polymer resin 63, and wavelength conversion particles 62 that absorb light in an ultraviolet wavelength band emitted from the semiconductor device 100 and generate visible light.

In the operation of rotating the bodies 10a and 10b, the bodies 10a and 10b may be rotated at high speed before the adhesive layer 60 is cured. In this process, the wavelength conversion particles may be precipitated into a lower portion of the polymer resin due to the rotation. The method of rotating the bodies 10a and 10b is not particularly limited. As an example, a rotating device used for centrifugal separation may be used. However, the present invention is not necessarily limited thereto, and, as shown in FIG. 14, a general rotating device including a shaft Sh1 fixed to the bodies 10a and 10b and a motor (not shown) configured to rotate the shaft Sh1 may be selected. The direction in which the body is rotated may be determined according to a position at which the shaft is connected to the body.

The speed at which the bodies 10a and 10b are rotated is not particularly limited. The speed at which the bodies 10a and 10b are rotated is not greatly limited as long as it is a speed capable of transmitting kinetic energy so that the wavelength conversion particles can move within the polymer resin that has not been cured.

According to such a configuration, the wavelength conversion particles may be precipitated or may be moved outward in the adhesive layer so that adhesion to the light-transmitting member 50 may be enhanced. Afterward, the adhesive layer 60 may be cured to complete the process.

FIGS. 15A and 15B are a schematic cross-sectional view and a plan view of a semiconductor device package according to a fifth embodiment of the present invention, respectively.

Referring to FIGS. 15A and 15B, the semiconductor device package according to the embodiment includes a body 10 including a first cavity 11 and a second cavity 12, a first semiconductor device 100 and a second semiconductor device 200 disposed in the body 10, and a light-transmitting member 30 disposed above the body 10.

First, the body 10 may be manufactured by processing an aluminum substrate as described above. However, the body 10 is not necessarily limited thereto and may be made of a non-conductive material.

The body 10 may include the first cavity 11 and a third cavity 13.

First, the first cavity 11 may be disposed at an upper portion of the body 10. The first cavity 11 may be disposed above the third cavity 13 and may be greater in area than the third cavity 13. With such a configuration, the extraction efficiency of light emitted from the first semiconductor device 100 and the second semiconductor device 200 may be improved.

For example, the first cavity 11 may be formed in various shapes such as a polygonal shape, a circular shape, and the like and may be formed to be inclined such that the area of the first cavity 11 is greater in a direction in which light is emitted. However, the present invention is not limited to such a structure.

The first semiconductor device 100 may be disposed in the first cavity 11. The first semiconductor device 100 may be electrically connected to a conductive portion (not shown), which has a polarity different from that of the first semiconductor device 100, in the body 10 to receive current and emit light. The first semiconductor device 100 may output light having an ultraviolet wavelength band as a peak wavelength.

The third cavity 13 may be disposed at a lower portion of the body 10 and may be positioned below the first cavity 11. The third cavity 13 may be a groove that further protrudes toward a lower surface of the body 10 from the first cavity 11. The second semiconductor device 200 may be disposed in the third cavity 13. Like the first semiconductor device 100, the second semiconductor device 200 may be electrically connected to a conductive portion (not shown), which has a polarity different from that of the second semiconductor device 200, in the body 10 to receive current and emit light.

The second semiconductor device 200 may emit blue light. However, the second semiconductor device 200 is not limited thereto and may generate light having a visible wavelength band as a peak wavelength. The second semiconductor device 200 may be provided with electricity simultaneously with the first semiconductor device 100. For example, the second semiconductor device 200 may generate visible light at the same time when the first semiconductor device 100 generates ultraviolet light. With such a configuration, the semiconductor device package according to the embodiment may recognize whether the visible light is generated in the first semiconductor device 100.

Further, the second semiconductor device 200 may operate as a Zener diode. For example, the second semiconductor device 200 may be connected in parallel with the first semiconductor device 100 to increase the withstanding voltage of the semiconductor device package.

In addition, the second semiconductor device 200 may be disposed in the third cavity 13 and may be positioned below the first semiconductor device 100. Thus, the light emitted from the first semiconductor device 100 is prevented from being absorbed by the second semiconductor device 200, thereby improving light extraction efficiency.

FIG. 16 is a perspective view of a semiconductor device package according to a sixth embodiment of the present invention, FIG. 17 is a plan view of the semiconductor device package according to the sixth embodiment of the present invention, FIG. 18 is a cross-sectional view of the semiconductor device package according to the sixth embodiment of the present invention, and FIG. 19 is an enlarged view of portion K in FIG. 18.

Referring to FIGS. 16 and 17, the semiconductor device package according to the embodiment may include a body 10 including a first cavity 11, a second cavity 12, and a third cavity 13, a first semiconductor device 100 disposed in the first cavity 11, a second semiconductor device 200 disposed in the third cavity 13, and a light-transmitting member 30 disposed on the second cavity 12.

A material of the body 10 may be applied in the same manner as described above. The body 10 may include a first conductive portion 10a and a second conductive portion 10b. An insulating portion 20 may be disposed between the first conductive portion 10a and the second conductive portion 10b. Since both of the first conductive portion 10a and the second conductive portion 10b have conductivity, the insulating portion 20 should be disposed so as to separate poles.

The first conductive portion 10a may be disposed to face the second conductive portion 10b. The first conductive portion 10a may include an inner side surface S14 on which the insulating portion 20 is positioned between the first conductive portion 10a and the second conductive portion 10b, and outer side surfaces S11, S12, and S13 forming side surfaces of the body 10.

Similarly, the second conductive portion 10b may be disposed to face the first conductive portion 10a. The second conductive portion 10b may include an inner side surface S24 on which the insulating portion 20 is disposed between the second conductive portion 10b and the first conductive portion 10a, and outer side surfaces S21, S22, and S23 forming side surfaces of the body 10.

The body 10 may include the second cavity 12 disposed on an upper surface thereof, the first cavity 11, and the third cavity 13.

First, the second cavity 12 may be disposed on the upper surface of the body 10. The second cavity 12 may be disposed above the first cavity 11. The second cavity 12 is formed to have an area greater than those of the first cavity 11 and the third cavity 13 so that the extraction efficiency of light emitted from the first semiconductor device 100 and the second semiconductor device 200 may be improved. In addition, the light-transmitting member 30 may be disposed in the second cavity 12.

Further, the second cavity 12 may include a plurality of recesses 17 protruding from an outer circumferential surface thereof toward corners M1, M2, M3, and M4 of the body 10.

The first cavity 11 may be disposed below the second cavity 12 and above the third cavity 13. The first cavity 11 may be a groove that further protrudes toward a lower surface of the body 10 from the second cavity 12. The first semiconductor device 100 may be disposed in the first cavity 11. The first cavity 11 may include air, gas, or resin.

The third cavity 13 may be disposed below the first cavity 11. The third cavity 13 may be a groove that further protrudes toward the lower surface of the body 10 from the first cavity 11. The second semiconductor device 200 may be disposed in the third cavity 13.

The third cavity 13 may be disposed on connection lines I1 and I2 virtually connecting the corners M1, M2, M3, and M4 of the body 10 and the first semiconductor device 100. In addition, the third cavity 13 may be positioned on the connection lines I1 and I2 between the first semiconductor device 100 and the corners M1, M2, M3, and M4.

Specifically, the body 10 may include a plurality of corners M1, M2, M3, and M4. For example, the body 10 may have a hexahedral shape, but the present invention is not limited thereto. However, hereinafter, a description will be made on the basis of the above description.

As described above, the body 10 may include a plurality of outer side surfaces in the first conductive portion 10a and the second conductive portion 10b. For example, the first conductive portion 10a may include a third corner M3 and a fourth corner M4 at which the outer side surfaces S11, S12, and S13 are in contact with each other. The third corner M3 may be a portion at which a first-third outer side surface S13 is in contact with a first-first outer side surface S11. The fourth corner M4 may be a portion at which the first-first outer side surface S11 is in contact with a first-second outer side surface S12.

Further, the second conductive portion 10b may include a first corner M1 and a second corner M2 at which the outer side surfaces S21, S22, and S23 are in contact with each other. The first corner M1 may be a portion at which a second-first outer side surface S21 is in contact with a second-second outer side surface S22. The second corner M2 may be a portion at which the second-first outer side surface S21 is in contact with a second-third outer side surface S23.

In addition, the connection lines may include a first connection line I1 and a second connection line I2. Here, the first connection line I1 may be a straight line virtually connecting the first semiconductor device 100, the second corner M2, and the fourth corner M4. In addition, the second connection line I2 may be a straight line virtually connecting the first semiconductor device 100, the first corner M1, and the third corner M3.

The first connection line I1 may intersect the second connection line I2, and the first semiconductor device 100 may be disposed on the intersection. In addition, the plurality of recesses 17 may be positioned on the first connection line I1 and the second connection line I2. For example, the second cavity 12 may include the plurality of recesses 17 protruding from the outer circumferential surface thereof toward the first to fourth corners M1 to M4 of the body 10.

In this case, the third cavity 13 may be positioned on the first and second connection lines I1 and I2 between the first semiconductor device 100 and the corners M1, M2, M3, and M4. For example, the third cavity 13 may be disposed on the first connection line I1 between the first semiconductor device 100 and the recess 17, and, in the case of the plurality of recesses 17, the third cavity 13 may be positioned between the first semiconductor device 100 and at least one of the plurality of recesses 17.

In addition, the third cavity 13 may be disposed on the first connection line I1 between the first semiconductor device 100 and a first groove 61 to be described below.

With such a configuration, the third cavity 13 may be positioned adjacent to the corner M1, M2, M3, or M4, and air existing in the first cavity 11 and the third cavity 13 may be easily discharged to the outside. Accordingly, the semiconductor device package according to another embodiment may prevent the light-transmitting member 30 from protruding upward, thereby improving light extraction efficiency and reliability. This will be described below in detail with reference to FIGS. 18 and 19.

Referring to FIGS. 18 and 19, the second cavity 12 is disposed on the upper surface of the body 10 and may include a second bottom surface 12a and a second inclined surface 12b. In this case, the second inclined surface 12b of the second cavity 12 may be disposed to be perpendicular to the second bottom surface 12a thereof. However, the present invention is not necessarily limited thereto.

In addition, the light-transmitting member 30 may be disposed on the second bottom surface 12a of the second cavity 12. Thus, the second cavity 12 may have a diameter allowing the light-transmitting member 30 to be disposed. In addition, a material of the light-transmitting member 50 is not specifically limited as long as it is a material capable of transmitting light in an ultraviolet wavelength band. As an example, the light transmitting layer may include an optical material such as quartz having a high light transmittance in an ultraviolet wavelength, but the present invention is not limited thereto.

Further, the second bottom surface 12a of the second cavity 12 may support the light-transmitting member 30, and an outer circumferential surface of the light-transmitting member 30 may be disposed to be spaced apart from the second inclined surface 12b of the second cavity 12.

Further, an adhesive member 40 may be disposed between the second bottom surface 12a of the second cavity 12 and the light-transmitting member 30. The adhesive member 40 may allow bonding between the second bottom surface 12a and the light-transmitting member 30 to be made between the second bottom surface 12a of the second cavity 12 and the light-transmitting member 30. In addition, when the adhesive member 40 is overfilled, the excess of the adhesive member 40 may be pushed out to the recess 17. Accordingly, even when the adhesive member is excessively coated, the light-transmitting member 50 may remain level.

Further, the first cavity 11 is disposed below the second cavity 12 and may include a first bottom surface 11a and a first inclined surface 11b.

The first inclined surface 11b of the first cavity 11 may be disposed to be perpendicular to the first bottom surface 11a thereof. However, the first inclined surface 11b is not necessarily limited thereto and may be disposed to have an inclination angle greater than 90° with respect to the first bottom surface 11a to reflect the light emitted from the first semiconductor device 100 and the second semiconductor device 200 upward. As described above, since the body 10 is made of aluminum, the body 10 may reflect light in an ultraviolet wavelength band upward even without a separate reflective member.

Further, the first cavity 11 may include the first groove 61 disposed between an outer circumferential surface of the body 10 and the first semiconductor device 100. Here, the outer circumferential surface of the body 10 may include the above-described outer side surfaces S11, S12, S13, S21, S22, and S23 of the body 10.

In addition, the first groove 61 may be disposed between the recess 17 and the first semiconductor device 100. Specifically, the first groove 61 may protrude toward the corners M1, M2, M3, and M4 of the body 10 from the outer circumferential surface of the first cavity 11. Accordingly, since the first groove 61 is disposed between the outer circumferential surface of the body 10 (or the recess 17) and the first semiconductor device 100, the first groove 61 may be positioned on the first connection line I1. Thus, the first semiconductor device 100, the third cavity 13, the first groove 61, and the recess 17 may be disposed on the first connection line I1, and the third cavity 13 and the first groove 61 may be disposed adjacent to the recess 17.

The third cavity 13 is disposed below the first cavity 11 and may include a third bottom surface 13a and a third inclined surface 13b.

The third inclined surface 13b of the third cavity 13 may be disposed to be perpendicular to the third bottom surface 13a thereof, but the present invention is not necessarily limited thereto. The third inclined surface 13b may be disposed to have an inclination angle greater than 90° with respect to the third bottom surface 13a to reflect the light emitted from the second semiconductor device 200 upward.

The first cavity 11 may include a first air layer A1 having air disposed therein. Similarly, the third cavity 13 may include a second air layer A2 having air disposed therein.

As described above, the third cavity 13 may be disposed between the recess 17, to which the adhesive member 40 is applied, and the first semiconductor device 100. Accordingly, the second air layer A2 of the third cavity 13 may also be disposed adjacent to the recess 17 so that a pressure P of air provided from the first cavity 11 toward the light-transmitting member 30 and the second bottom surface 12a may be affected by both the first air layer A1 and the second air layer A2. Thus, when the light-transmitting member 30 is positioned in the second cavity 12, air existing in the first air layer A1 and the second air layer A2 may be easily discharged to the outside of the semiconductor device package through the first groove 61. Accordingly, the pressure, which is generated by the air in the first cavity 11 and the third cavity 13 in the body 10 and applied upwardly to the light-transmitting member 30, may be reduced. As a result, the reliability of the semiconductor device package according to the embodiment may be improved.

In addition, since the third cavity 13 is disposed adjacent to the first groove 61, the pressure of the air discharged through the first groove 61 may increase, thereby improving process efficiency. In addition, the bonding force between the light-transmitting member 30 and the second bottom surface 12a may be increased by reducing the air in the first cavity 11 and the third cavity 13. With such a configuration, in the semiconductor device package according to the embodiment, reliability and light extraction efficiency may be improved.

Further, the second semiconductor device 200 may be disposed on the third bottom surface 13a. In addition, the second semiconductor device 200 may be covered by a phosphor layer 210. The phosphor layer 210 may be disposed in the third cavity 13 and may be a yttrium-aluminum-garnet (YAG)-based phosphor, a nitride-based phosphor, a silicate, or a mixture thereof, but the present invention is not limited thereto. The phosphor layer 210 may convert the light emitted from the second semiconductor device 200 into light of a visible wavelength band having a different peak wavelength. For example, the phosphor layer 210 may be excited by blue light output from the second semiconductor device 200 and emit yellow light, and finally, the yellow light and the blue light may be mixed so that white light may be emitted from the semiconductor device package. However, only the second semiconductor device 200 may be disposed in the third cavity 13 without the phosphor layer 210. A ratio of a height of the third cavity 13 in a second direction (Y-axis direction) and a maximum width of the third cavity 13 in a first direction (X-axis direction) may be in a range of 1:2 to 1:5. Here, the second direction (Y-axis direction) may be a direction from the lower surface of the body 10 to the upper surface thereof. In addition, the first direction (X-axis direction) may be a direction perpendicular to the second direction.

When the ratio of the height of the third cavity 13 in the second direction (Y-axis direction) and the maximum width in the first direction (X axis direction) is less than 1:2, there may be a limit to the pressure at which air is discharged toward the recess 17 being reduced.

Further, when the ratio of the height of the third cavity 13 in the second direction (Y-axis direction) and the maximum width in the first direction (X axis direction) is greater than 1:5, there may be a problem in that the loss of light emitted from the first semiconductor device 100 increases.

Further, the first bottom surface 11a of the first cavity 11 may be positioned further upward than an upper surface 210a of the phosphor layer 210. That is, in the first cavity 11, the second air layer A2 may be positioned between the upper surface 210a and the first bottom surface 11a of the phosphor layer 210.

In addition, the upper surface 210a of the phosphor layer 210 may have a curved shape, but the present invention is not limited to such a shape.

The first semiconductor device 100 may be disposed in the first cavity 11. The first semiconductor device 100 may be disposed on the first conductive portion 10a and may be electrically connected to the first conductive portion 10a and the second conductive portion 10b. A submount (not shown) may be disposed in the first cavity 11, and the first semiconductor device 100 may be disposed on the submount (not shown). In the second conductive portion 10b, a pad (not shown) to which a wire is bonded may be disposed on the first bottom surface 11a of the first cavity 11.

The second semiconductor device 200 may be disposed in the first cavity 11. The second semiconductor device 200 may be disposed on the second conductive portion 10b and may be electrically connected to the first conductive portion 10a and the second conductive portion 10b. A submount (not shown) may be disposed in the third cavity 13, and the second semiconductor device 200 may be disposed on the submount (not shown). In the first conductive portion, a pad (not shown) to which a wire 10a is bonded may be disposed on the first bottom surface 11a of the first cavity 11.

As described above, the second semiconductor device 200 may emit blue light. However, the second semiconductor device 200 is not limited thereto and may generate light having a visible wavelength band as a peak wavelength. Like the first semiconductor device 100, the second semiconductor device 200 is electrically connected to the first conductive portion 10a and the second conductive portion 10b, and thus, when electricity is applied to the first semiconductor device 100, the second semiconductor device 200 may be simultaneously provided with the electricity. For example, when the first semiconductor device 100 generates ultraviolet light, the second semiconductor device 200 may simultaneously generate visible light. With such a configuration, the semiconductor device package according to the embodiment may recognize whether the visible light is generated in the first semiconductor device 100.

Further, the second semiconductor device 200 may operate as a Zener diode. Thus, the second semiconductor device 200 may be connected to the first semiconductor device 100, for example, in parallel, to increase the withstanding voltage of the semiconductor device package.

In addition, as described above, the second semiconductor device 200 may be disposed in the third cavity 13 and may be positioned below the first semiconductor device 100. Thus, the light emitted from the first semiconductor device 100 is prevented from being absorbed by the second semiconductor device 200, thereby improving light extraction efficiency.

FIG. 20 is a cross-sectional view of a semiconductor device package according to another embodiment of the present invention.

Referring to FIG. 20, descriptions of a body 10, an insulating portion 20, a light-transmitting member 30, and an adhesive member 40 may be applied in the same manner as described with reference to FIGS. 16 to 19. However, unlike the previous description, a second cavity 12 may include a recess 17 protruding toward a corner thereof, and a first cavity 11 may include a first groove 61 protruding toward a corner thereof. However, the first groove 61 may be disposed only between a third cavity 13 and the recess 17. As a result, the third cavity 13 may provide a space for a second semiconductor device 200 providing visible light while improving the reliability of the semiconductor device package. In addition, the first groove 61 and the third cavity 13 may improve the adhesion between the light-transmitting member 30 and a second bottom surface 12a so that the reliability of the semiconductor device package may be improved.

FIG. 21 is a view illustrating a modified example of FIG. 18.

Referring to FIG. 21, the first groove 61 may protrude toward a second corner M2 from an outer circumferential surface of the first cavity 11 and may be inclined at a predetermined angle. For example, a lower surface of the first groove 61 may be formed to have a curved surface. With such a configuration, air may be easily discharged to the outside of the semiconductor device package.

FIG. 22 is a conceptual diagram of a semiconductor device package according to one embodiment of the present invention, FIG. 23 is a plan view of FIG. 22, FIG. 24 is an enlarged view of portion A in FIG. 22, FIG. 25 is a cross-sectional view taken along line A-A in FIG. 23, and FIGS. 26A and 26B are views for describing a problem in which an adhesion failure of a light-transmitting member occurs due to internal air pressure in a case in which a discharge groove is not present.

Referring to FIG. 22, the semiconductor device package according to the embodiment may include a body 10 including a first cavity 11, a semiconductor device 100 disposed in the first cavity 11, and a light-transmitting member 50 disposed on the first cavity 11.

The body 10 may be manufactured by processing an aluminum substrate. In the first cavity 11, a side surface may be disposed to be perpendicular to a lower surface. However, the side surface is not necessarily limited thereto and may be disposed to have an inclination angle greater than 90° with respect to the lower surface and reflect light emitted from the semiconductor device 100 upward. As described above, since the body 10 is made of aluminum, an inner surface of the first cavity 11 may reflect light in an ultraviolet wavelength band upward even without a separate reflective member.

The semiconductor device 100 may be disposed in the first cavity 11. The semiconductor device 100 may be electrically connected to a first conductive portion 10a and a second conductive portion 10b. A submount 22 may be disposed in the first cavity 11, and the semiconductor device 100 may be disposed on the submount 22, but the present invention is not necessarily limited thereto. A pad (not shown) to which a wire is bonded may be disposed on a bottom of the first cavity 11.

A second cavity 12 may be disposed above the first cavity 11. The second cavity 12 may be disposed on a sidewall of the cavity. The second cavity 12 may extend outward from the sidewall of the first cavity 11.

The light-transmitting member 50 may be disposed in the second cavity 12. A material of the light-transmitting member 50 is not specifically limited as long as it is a material capable of transmitting light in an ultraviolet wavelength band. As an example, the light-transmitting member 50 may include an optical material such as quartz having a high light transmittance in an ultraviolet wavelength, but the present invention is not limited thereto.

Referring to FIG. 23, the second cavity 12 may include a first side surface S21 and a third side surface S23 facing each other, a second side surface S22 and a fourth side surface S24 facing each other, a first corner at which the first side surface S21 is connected to the second side surface S22, a second corner at which the second side surface S22 is connected to the third side surface S23, a third corner at which the third side surface S23 is connected to the fourth side surface S24, and a fourth corner at which the fourth side surface S24 is connected to the first side surface S21.

A planar shape of the second cavity 12 may be a quadrangular shape, but is not necessarily limited thereto, and may be a polygonal shape such as a triangular shape, a hexagonal shape, or the like.

The second cavity 12 may include first to fourth recesses 17a, 17b, 17c, and 17d formed at the first to fourth corners, respectively. The first recess 17a may be disposed at the first corner, the second recess 17b may be disposed at the second corner, the third recess 17c may be disposed at the third corner, and the fourth recess 17d may be disposed at the fourth corner.

When the light-transmitting member 50 has a quadrangular shape with no curvature at the corners, in consideration of tolerance, the first to fourth recesses 17a, 17b, 17c, and 17d may be formed. If the first to fourth recesses 17a, 17b, 17c, and 17d are not formed, the light-transmitting member 50 may not be inserted into the second cavity 12 when the light-transmitting member 50 rotates in a counterclockwise direction or counterclockwise direction. However, in the case in which the first to fourth recesses 17a, 17b, 17c, and 17d are formed, the light-transmitting member 50 may be inserted into the second cavity 12 even when the light-transmitting member 50 rotates to some extent.

The second cavity 12 may include a first groove 61 disposed in a stepped portion 15. The case in which the first groove 61 is disposed in the first recess 17a is illustrated as an example, but the present invention is not necessarily limited thereto. The first groove 61 may be disposed in the second to fourth recesses 17b, 17c, and 17d. The first groove 61 may be connected to the first cavity 11 through the sidewall of the first cavity 11. Thus, air inside the first cavity 11 may be discharged to the outside through the first groove 61.

The first groove 61 may include a first region 61a overlapping the light-transmitting member 50 in a vertical direction and a second region 61b not overlapping the light-transmitting member 50 in the vertical direction. When the first groove 61 completely overlaps the light-transmitting member 50 in the vertical direction, it may be difficult for the air inside the first cavity 11 to be discharged through the first groove 61 when the light-transmitting member 50 is disposed.

The body 10 may include a first outer side surface S11 and a third outer side surface S13 opposite to each other, a second outer side surface S12 and a fourth outer side surface S14 opposite to each other, a fifth corner V1 at which the first outer side surface S11 is connected to the second outer side surface S12, a sixth corner V2 at which the second outer side surface S12 is connected to the third outer side surface S13, a seventh corner V3 at which the third outer side surface S13 is connected to the fourth outer side surface S14, and an eighth corner V4 at which the fourth outer side surface S14 is connected to the first outer side surface S11.

Here, the first recess 17a may extend toward the fifth corner V1, the second recess 17b may extend toward the sixth corner V2, the third recess 17c may extend toward the seventh corner V3, and the fourth recess 17d may extend toward the eighth corner V4.

Referring to FIG. 24, when the light-transmitting member 50 is inserted into the second cavity 12, a part of the air inside the first cavity 11 may be discharged. Thus, a problem in that an adhesion failure occurs in the light-transmitting member 50 due to the air being compressed inside the first cavity 11 may be solved.

Referring to FIG. 25, after the light-transmitting member 50 is disposed, an adhesive layer 71 may be filled to fix the light-transmitting member 50 to the second cavity 12. Here, the adhesive layer 71 may include a first adhesive portion 71a that is filled in the first groove 61. That is, when an adhesive is injected, a part of the adhesive may be filled in the first groove 61 and cured. Thus, the first cavity 11 may be blocked from the outside due to the adhesive layer 71.

Here, the adhesive layer 71 may include all of the structures described with reference to FIGS. 2 and 3. As an example, the adhesive layer 71 may include a polymer resin, and wavelength conversion particles that absorb light in an ultraviolet wavelength band and generate light in a visible wavelength band.

Referring to FIG. 26A, in a case in which the light-transmitting member 50 is disposed in the second cavity 12 without a structure of the first groove 61, internal air pressure may be increased due to an increase in an amount of air compressed in the first cavity 11. Accordingly, since a force that pushes the light-transmitting member 50 upward is increased due to the increase in the amount of internal compressed air as described in FIG. 26B, a problem may occur in which the light-transmitting member 50 is not bonded at an initial insertion position of the light-transmitting member 50. Accordingly, an adhesion failure may occur. The adhesion failure may include a failure in which the light-transmitting member 50 is obliquely bonded thereto.

FIG. 27 is a view illustrating a modified example of FIG. 23, FIG. 28 is a cross-sectional view taken along line B-B in FIG. 23, and FIG. 29 is a bottom view of FIG. 22.

Referring to FIG. 27, the first groove 61 may be formed in all of the first to fourth recesses 17a, 17b, 17c, and 17d. According to such a structure, there is an advantage in that the air inside the first cavity 11 may be more easily discharged. However, the present invention is not necessarily limited thereto, and the first groove 61 may be disposed in only some of the first to fourth recesses 17a, 17b, 17c, and 17d.

Referring to FIGS. 28 and 29, the body 10 may include first and second grooves 14a and 14b disposed at corners at which a lower surface S3 and side surfaces S1 meet, and second insulating portions 41a and 41b disposed in the first and second grooves 14a and 14b, respectively. Each of the first and second grooves 14a and 14b may be disposed entirely along the corners at which the lower surface S3 and the side surfaces S1 of the body 10 meet.

Specifically, the body 10 may include the first groove 14a disposed in a region at which a lower surface S31 of the first conductive portion 10a and the side surface S1 meet, and the second groove 14b disposed at a region at which a lower surface S32 of the second conductive portion 10b and the side surface S1 meet.

The second insulating portions 41a and 41b may include a second-first insulating portion 41a disposed in the first groove 14a and a second-second insulating portion 41b disposed in the second groove 14b. Here, the second-first insulating portion 41a and the second-second insulating portion 41b may be integrally formed.

The shape of each of the first groove 14a and the second groove 14b is not particularly limited. The cross section of each of the first groove 14a and the second groove 14b may include a polygonal shape, a lens shape, or the like.

A material of the second insulating portions 41a and 41b may be the same as that of the first insulating portion 42, but the present invention is not necessarily limited thereto. The material of the first insulating portion 42 and the second insulating portions 41a and 41b may be selected from among an EMC, white silicone, a PSR, a silicone resin composition, a modified epoxy resin composition such as a silicone modified epoxy resin, a modified silicone resin composition such as an epoxy modified silicone resin, a polyimide resin composition, a modified polyimide resin composition, and a resin such as PPA, a polycarbonate resin, PPS, an LCP, an ABS resin, a phenol resin, an acrylic resin, a PBT resin, and the like.

According to the embodiment, since the second insulating portions 41a and 41b are disposed at the lower corners of the body 10, burrs may be prevented from being generated at the corners during cutting of the package. In a case of an aluminum substrate, burrs may be easily generated during cutting because the aluminum is a metal material. In a case in which the burrs are generated, the lower surface S3 is not flat, which may lead to poor mounting on a circuit board. In addition, in a case in which the burrs are generated, a thickness may be non-uniform, and some regions may be lifted, and thus a measurement error may also occur. Since the second insulating portions 41a and 41b are made of an insulating material, the burrs may not be easily generated during the cutting.

Inner surfaces of the first and second grooves 14a and 14b may have a roughness (not shown). When the inner surfaces of the first and second grooves 14a and 14b are smooth, adhesion between the first and second grooves 14a and 14b and the second insulating portions 41a and 41b may be weak. Thus, in order to fix the second insulating portions 41a and 41b, the roughness may be formed on the inner surfaces of the first and second grooves 14a and 14b by performing a surface treatment process.

The second insulating portions 41a and 41b may have a thickness d1 of 50 μm to 150 μm in a first direction (width in a Y-axis direction). The first direction (Y-axis direction) may be a direction from the lower surface of the body 10 to an upper surface thereof. When the thickness is greater than or equal to 50 μm, sufficient thickness may be secured so that the burrs are prevented from being generated during cutting of the package. When the thickness is less than or equal to 150 μm, the second insulating portions 41a and 41b may be prevented from protruding to the lower surface S3 of the body 10.

The second insulating portions 41a and 41b may have a width w1 of 100 μm to 300 μm in a second direction (width in an X-axis direction). The second direction (X-axis direction) may be a direction perpendicular to the first direction. When the width is greater than or equal to 100 μm, the second insulating portions 41a and 41b may be sufficiently fixed to the first and second grooves 14a and 14b, respectively. When the width is less than or equal to 300 μm, an area in which an electrode is mounted may be secured on the lower surface S3 of the body 10.

According to the embodiment, in the second insulating portions 41a and 41b, a ratio (d1:w1) of the thickness to the width may be in a range of 1:1.5 to 1:6. That is, in the second insulating portions 41a and 41b, the width may be greater than the thickness. When the ratio of the thickness to the width is satisfied, the second insulating portions 41a and 41b are sufficiently fixed to the first groove 14 to suppress the generation of burrs.

In the first cavity 11, a side surface 11d may be disposed to be perpendicular to a lower surface 11c. However, the side surface is not necessarily limited thereto and may be disposed to have an inclination angle greater than 90° with respect to the lower surface and reflect light emitted from the semiconductor device 100 upward. As described above, since the body 10 is made of aluminum, an inner surface of the first cavity 11 may reflect light in an ultraviolet wavelength band upward even without a separate reflective member.

FIGS. 30A to 30C are views illustrating a method of fixing the light-transmitting member.

Referring to FIG. 30A, an adhesive 71 may be applied to the second cavity 12. The adhesive 71 may be applied along the entire circumference of the second cavity 12 and may be partially applied only to the recess 17 of the second cavity 12. The adhesive 71 applied to the recess 17 may be gradually spread on the bottom surface of the second cavity 12. However, the recess 17 in which the first groove 61 is disposed may not be applied.

The adhesive 71 may be one or more among an epoxy resin, a silicone resin, a polyimide resin, a urea resin, and an acrylic resin. As an example, the adhesive 71 may be a silicone resin or an epoxy resin. However, the adhesive is not limited thereto, and as for the adhesive, all of various materials capable of fixing the light-transmitting member to the body may be selected.

Referring to FIG. 30B, the light-transmitting member 50 may be fixed by the adhesive 71 when the light-transmitting member 50 is inserted into the second cavity 12. As described above, since the adhesive 71 is not applied to the recess 17 in which the first groove 61 is disposed, the air inside the first cavity 11 may be discharged through the first groove 61. Accordingly, a problem of air being condensed inside the first cavity 11 may be solved. In addition, since the first groove 61 is disposed in the recess 17, the first groove 61 may be formed to have a relatively great size so that the air may be easily discharged.

Referring to FIG. 30C, the adhesive 71 may be again applied to the recess 17 in which the first groove 61 is disposed to seal the inside of the first cavity 11. Here, a needle SP1 may be used as a method of applying the adhesive 71, but the present invention is not necessarily limited thereto, and all of the various filling methods may be applied.

When the adhesive 71 is injected into the recess 17 in which the first groove 61 is disposed, the adhesive 71 may be applied along the entire circumference of the second cavity 12. Thus, the first cavity 11 may be sealed.

The semiconductor device may be applied to various types of light source devices. As an example, the light source devices may be concepts including a sterilizing device, a curing device, a lighting device, a display device, a vehicle lamp, and the like. That is, the semiconductor device may be disposed in a case and applied to various electronic devices configured to provide light.

The sterilizing device may include the semiconductor device according to the embodiment to sterilize a desired region. The sterilizing device may be applied to household appliances, such as a water purifier, an air conditioner, a refrigerator, and the like, but the present invention is not necessarily limited thereto. That is, the sterilizing device may be applied to all of various products (e.g., medical devices) that need to be sterilized.

As an example, the water purifier may include a sterilizing device according to the embodiment to sterilize circulating water. The sterilizing device may be disposed at a nozzle or a discharge port through which water circulates so as to irradiate water with ultraviolet light. In this case, the sterilizing device may have a waterproof structure.

The curing device may include the semiconductor device according to the embodiment to cure various types of liquid. A liquid may be the broadest concept including various materials which are cured when irradiated with ultraviolet light. As an example, the curing device may cure various types of resins. Alternatively, the curing device may be applied to cure a cosmetic product such as a manicure.

The lighting device may include a light source module including the substrate and the semiconductor device according to the embodiment, a heat dissipation part configured to radiate heat of the light source module, and a power supplier configured to process or convert an electrical signal received from the outside and supply the signal to the light source module. In addition, the lighting device may include a lamp, a head lamp, a street light, or the like.

While the embodiments have been mainly described, they are only examples but do not limit the present invention, and it may be known to those skilled in the art that various modifications and applications, which have not been described above, may be made without departing from the essential properties of the embodiments. For example, the specific components described in the embodiments may be implemented while being modified. In addition, it will be interpreted that differences related to the modifications and applications fall within the scope of the present invention defined by the appended claims.

The invention claimed is:

1. A semiconductor device package comprising:
    a body including a cavity;
    a semiconductor device disposed in the cavity;
    a light-transmitting member disposed on the cavity; and
    an adhesive layer configured to fix the light-transmitting member to the body,
    wherein the semiconductor device generates light in an ultraviolet wavelength band, and
    wherein the adhesive layer includes a polymer resin, and wavelength conversion particles that absorb light in the ultraviolet wavelength band and generate light in a visible wavelength band.

2. The semiconductor device package of claim 1, wherein the cavity includes a stepped portion on which the light-transmitting member is disposed, and
    wherein the adhesive layer is disposed on the stepped portion.

3. The semiconductor device package of claim 2, wherein, in the wavelength conversion particles in the adhesive layer, the number of wavelength conversion particles disposed on an outer side based on a center of a width of the stepped portion in a radial direction is greater than the number of wavelength conversion particles disposed on an inner side based on the center of the width.

4. The semiconductor device package of claim 3, wherein a height of the wavelength conversion particle, which is disposed highest at the center of the width of the stepped portion in the radial direction, is 80% or less of a thickness of the adhesive layer.

5. The semiconductor device package of claim 2, wherein the stepped portion includes:
    a plurality of side surfaces;
    a plurality of corners each connecting adjacent side surfaces of the plurality of side surfaces to each other;
    a plurality of recesses disposed at the plurality of corners, respectively; and
    a first groove disposed on a bottom surface of at least one of the plurality of recesses.

6. The semiconductor device package of claim 5, wherein the first groove is connected to the cavity through a sidewall of the cavity.

7. The semiconductor device package of claim 6, wherein the first groove includes a first region overlapping the light-transmitting member in a vertical direction and a second region not overlapping the light-transmitting member in the vertical direction.

8. The semiconductor device package of claim 5, wherein the stepped portion includes:
    a first side surface and a third side surface facing each other;
    a second side surface and a fourth side surface facing each other;
    a first corner at which the first side surface is connected to the second side surface;
    a second corner at which the second side surface is connected to the third side surface;
    a third corner at which the third side surface is connected to the fourth side surface;
    a fourth corner at which the fourth side surface is connected to the first side surface; and a first recess, a second recess, a third recess, and a fourth recess which are disposed in the first to fourth corners, respectively.

9. The semiconductor device package of claim 8, wherein the body includes a first outer side surface and a third outer side surface opposite to each other, a second outer side surface and a fourth outer side surface opposite to each other, a fifth corner at which the first outer side surface is connected to the second outer side surface, a sixth corner at which the second outer side surface is connected to the third outer side surface, a seventh corner at which the third outer side surface is connected to the fourth outer side surface, and an eighth corner at which the fourth outer side surface is connected to the first outer side surface, wherein the first recess extends toward the fifth corner,
wherein the second recess extends toward the sixth corner,
wherein the third recess extends toward the seventh corner, and
wherein the fourth recess extends toward the eighth corner.

10. The semiconductor device package of claim 8, wherein the stepped portion further includes a first groove disposed in at least one of the second to fourth recesses.

11. The semiconductor device package of claim 1, wherein the body includes a first conductive portion, a second conductive portion, and an insulating layer disposed between the first conductive portion and the second conductive portion.

12. The semiconductor device package of claim 1, wherein the wavelength conversion particles are included in an amount of 5 to 60 parts by weight based on 100 parts by weight of the polymer resin.

13. The semiconductor device package of claim 1, wherein the adhesive layer includes a first adhesive portion filled in a first groove.

14. A semiconductor device package comprising:
a body including a first cavity, a second cavity, and a third cavity;
a first semiconductor device disposed in the first cavity;
a second semiconductor device disposed in the third cavity;
a light-transmitting member disposed on the body; and
an adhesive layer configured to fix the light-transmitting member to the body,
wherein the first cavity includes a first groove disposed between an outer circumferential surface of the body and the first semiconductor device,
wherein the second cavity is disposed above the first cavity,
wherein the third cavity is disposed on a connection line connecting the first groove to the first semiconductor device,
wherein the third cavity is positioned at a lower portion of the body than the first cavity,
wherein the first semiconductor device outputs light having an ultraviolet wavelength band as a peak wavelength,
wherein the second semiconductor device outputs light having a visible wavelength band as a peak wavelength, and
wherein the adhesive layer includes a polymer resin, and wavelength conversion particles that absorb light in the ultraviolet wavelength band and generate light in the visible wavelength band.

15. The semiconductor device package of claim 14, wherein the first groove protrudes toward a corner of the body from the outer circumferential surface of the first cavity.

16. The semiconductor device package of claim 14, wherein a ratio of a height of the third cavity and a width of the third cavity is in a range of 1:2 to 1:5.

17. The semiconductor device package of claim 14, further comprising a phosphor layer disposed in the third cavity,
wherein the phosphor layer surrounds the second semiconductor device, has an upper surface disposed further downward than a lower surface of the first cavity, and outputs light having a peak wavelength different from that of light output from the second semiconductor device in the visible wavelength band.

18. The semiconductor device package of claim 14, wherein the body includes a first conductive portion, a second conductive portion, and an insulating portion disposed between the first conductive portion and the second conductive portion,
wherein the first semiconductor device is electrically connected to the first conductive portion and the second conductive portion, and
wherein the second semiconductor device is electrically connected to the first conductive portion and the second conductive portion.

19. The semiconductor device package of claim 14, wherein the wavelength conversion particles are included in an amount of 5 to 60 parts by weight based on 100 parts by weight of the polymer resin.

20. The semiconductor device package of claim 14, wherein the first groove includes a first region overlapping the light-transmitting member in a vertical direction and a second region not overlapping the light-transmitting member in the vertical direction.

* * * * *